United States Patent
Kim et al.

(10) Patent No.: US 10,827,630 B2
(45) Date of Patent: Nov. 3, 2020

(54) ROLLABLE DISPLAY

(71) Applicant: LG Display Co., Ltd., Seoul (KR)

(72) Inventors: Jeonghun Kim, Goyang-si (KR); Bongchul Kim, Daegu (KR); Jaewook Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/294,499

(22) Filed: Mar. 6, 2019

(65) Prior Publication Data
US 2019/0208650 A1    Jul. 4, 2019

Related U.S. Application Data

(63) Continuation of application No. 15/404,155, filed on Jan. 11, 2017, now Pat. No. 10,257,945.

(30) Foreign Application Priority Data

Apr. 29, 2016    (KR) .................. 10-2016-0052725

(51) Int. Cl.
*H05K 5/00*    (2006.01)
*G06F 1/16*    (2006.01)
(Continued)

(52) U.S. Cl.
CPC ......... *H05K 5/0017* (2013.01); *G06F 1/1652* (2013.01); *G09F 9/301* (2013.01);
(Continued)

(58) Field of Classification Search
CPC ............... H05K 5/0017; H05K 1/147; H05K 2201/10128; H05K 1/189; G09F 9/301; G06F 1/1652
(Continued)

(56) References Cited

U.S. PATENT DOCUMENTS 7,864,418 B2 *   1/2011   Kuroi .................... F16M 11/38
                                                              359/443
8,096,068 B2    1/2012   Van Rens
(Continued)

FOREIGN PATENT DOCUMENTS

CN            100350439 C      11/2007
CN            100363960 C       1/2008
(Continued)

OTHER PUBLICATIONS

Combined search and examination report, Intellectual Property Office (UK) Patent Application No. GB1622141.8, dated Jun. 20, 2017, 8 pages.
(Continued)

*Primary Examiner* — Daniel P Wicklund
*Assistant Examiner* — Sagar Shrestha
(74) *Attorney, Agent, or Firm* — Fenwick & West LLP

(57) ABSTRACT

A rollable display includes a flexible display panel where pixels are arranged to display an image; a reinforcing structure that is bonded to the rear side of the flexible display panel and divided into a plurality of segments; a roller that is bonded to one end of the flexible display panel and allows the flexible display panel to be rolled around the circumference; a data PCB (printed circuit board) located on the rear side of the flexible display panel; a first connecting member that connects the data PCB to the flexible display panel; a control board accommodated in the internal space of the roller; and a second connecting member that connects the control board to the data PCB, wherein each of the segments of the reinforcing structure comprises a through hole into which the second connecting member is slidably inserted.

13 Claims, 30 Drawing Sheets

(51) Int. Cl.
  *G09F 9/30* (2006.01)
  *H05K 1/14* (2006.01)
  *H05K 1/18* (2006.01)

(52) U.S. Cl.
  CPC ............ *H05K 1/147* (2013.01); *H05K 1/189* (2013.01); *H05K 2201/10128* (2013.01)

(58) Field of Classification Search
  USPC ............ 361/679.01–679.07, 679.21, 679.22, 361/679.26, 679.27
  See application file for complete search history.

(56) References Cited

U.S. PATENT DOCUMENTS

| | | | |
|---|---|---|---|
| 9,390,642 B2 | 7/2016 | Kim et al. | |
| 9,684,340 B2* | 6/2017 | Han | G06F 1/1652 |
| 9,877,382 B2* | 1/2018 | Lee | H05K 1/0259 |
| 2002/0196205 A1 | 12/2002 | Yamakado et al. | |
| 2004/0183958 A1 | 9/2004 | Akiyama et al. | |
| 2006/0007368 A1 | 1/2006 | Slikkerveer et al. | |
| 2006/0107566 A1* | 5/2006 | Van Rens | G09F 9/35 40/515 |
| 2008/0247126 A1 | 10/2008 | Otsuka et al. | |
| 2009/0295422 A1* | 12/2009 | Hamer | G09G 3/3233 324/760.02 |
| 2011/0007042 A1* | 1/2011 | Miyaguchi | G02F 1/133305 345/204 |
| 2011/0043976 A1 | 2/2011 | Visser et al. | |
| 2012/0008294 A1* | 1/2012 | Minoo | H05K 1/183 361/764 |
| 2012/0212433 A1 | 8/2012 | Lee et al. | |
| 2013/0182403 A1 | 7/2013 | Yang | |
| 2013/0207946 A1 | 8/2013 | Kim et al. | |
| 2013/0342785 A1 | 12/2013 | Tsai et al. | |
| 2014/0004906 A1 | 1/2014 | Chi et al. | |
| 2014/0362512 A1* | 12/2014 | Hinson | G06F 1/1652 361/679.21 |
| 2015/0268914 A1 | 9/2015 | Kim et al. | |
| 2015/0325804 A1 | 11/2015 | Lindblad | |
| 2016/0054758 A1 | 2/2016 | Han | |
| 2016/0086563 A1* | 3/2016 | Park | G09G 3/3696 345/211 |
| 2016/0231843 A1* | 8/2016 | Kim | G06F 3/0412 |
| 2016/0239050 A1* | 8/2016 | Kim | G06F 1/1652 |
| 2016/0363960 A1* | 12/2016 | Park | G06F 1/1656 |
| 2017/0031388 A1* | 2/2017 | Han | G06F 1/1652 |
| 2017/0060183 A1 | 3/2017 | Zhang et al. | |

FOREIGN PATENT DOCUMENTS

| | | |
|---|---|---|
| CN | 103247235 A | 8/2013 |
| CN | 104714699 A | 6/2015 |
| EP | 3012685 A1 | 4/2016 |
| WO | WO 2004/047059 A1 | 6/2004 |
| WO | WO 2009/148313 A1 | 12/2009 |

OTHER PUBLICATIONS

Combined search and examination report, Intellectual Property Office (UK) Patent Application No. GB1813386.8, dated Oct. 31, 2018, 3 pages.
First Office Action, Chinese Patent Application No. 201710014545.1, dated Dec. 24, 2018, 13 pages.
United States Office Action, U.S. Appl. No. 15/404,155, dated Aug. 9, 2018, 12 pages.
United States Office Action, U.S. Appl. No. 15/404,155, dated Jun. 4, 2018, 21 pages.
United States Office Action, U.S. Appl. No. 15/404,155, dated Oct. 20, 2017, 17 pages.

* cited by examiner

First state

ROLLABLE DISPLAY

CROSS-REFERENCE TO RELATED APPLICATIONS

This application is a continuation of U.S. patent application Ser. No. 15/404,155 filed on Jan. 11, 2017, which claims the priority benefit of Republic of Korea Patent Application No. 10-2016-0052725 filed on Apr. 29, 2016, which are hereby incorporated herein by reference for all purposes as if fully set forth herein.

BACKGROUND

Field of the Invention

The present invention relates to a rollable display.

Discussion of the Related Art

With the development of information technology, the market for displays, which act as an intermediary between users and information, is growing. Thus, display devices such as organic light-emitting displays (OLEDs), liquid crystal displays (LCDs), and plasma display panels (PDPs) are increasingly used.

Among the above-explained display devices, an organic light-emitting display comprises a flexible display panel comprising a plurality of subpixels and a drive part that drives the flexible display panel. The drive part comprises a scan driver that supplies a scan signal (or gate signal) to the flexible display panel, a data driver that supplies a data signal to the flexible display panel, etc.

Since the organic light-emitting display offers flexibility, the flexible display panel can be bent or curved and the shape of the flexible display panel can be changed by rolling and unrolling it like a scroll. For this reason, more and more attempts are being made to design the flexible display panel of the organic light-emitting display and a mechanical structure for holding it in various shapes.

SUMMARY

Embodiments relate to a rollable display comprising a flexible display panel, a reinforcing structure, a roller, a printed circuit board, a control board and a connecting member. The flexible display panel has pixels to display an image on a front side of the flexible display panel. The reinforcing structure is attached to a rear side of the flexible display panel and includes a plurality of segments with through holes. The roller is attached to one end of the flexible display panel and has a circumference surface onto which the flexible display panel is rolled. The printed circuit board is on the flexible display pane. The control board is in the roller. The connecting member connects the control board to the printed circuit board, the connecting member slidably inserted into the through holes.

In one embodiment, the rollable display further includes an auxiliary sheet between an end of the flexible display panel to the roller to couple the flexible display panel to the roller.

In one embodiment, each of the segments has a shape of a bar that extends in a first direction and is arranged side by side in a second direction perpendicular to the first direction.

In one embodiment, adjacent segments are spaced apart by a set distance.

In one embodiment, a buffering member is provided in at least part of an inside surface of a through hole of a segment.

In one embodiment, each of the segments includes an attaching surface bonded to the flexible display panel, and an attached surface opposite the attaching surface. The surface between the attaching surface and the attached surface has a predetermined curvature.

In one embodiment, each of the segments includes an attaching surface bonded to the flexible display panel, and an attached surface opposite the attaching surface. The rollable display further includes a buffering member bonded to the attached surface.

In one embodiment, at least one of the segments further includes a recess having a shape of a hole or the shape of a groove.

In one embodiment, the rollable display further includes at least another connecting member. Each of the segments of the reinforcing structure includes at least another through hole. At least another connecting member is inserted into the at least another through hole.

In one embodiment, the rollable display further includes an adhesive member that fixes part of the connecting member to at least one side of the control board.

In one embodiment, the rollable display further includes a support block provided between the flexible display panel and the printed circuit board, and a cover holder that is bonded to the support block and accommodates part of the connecting member.

In one embodiment, each of the segments comprises a front case bonded to the rear side of the flexible display panel, a rear case placed opposite the front case, and at least one middle case placed between the front case and the rear case. A through hole is an internal space between the front case, rear case, and middle case.

In one embodiment, each of the segments is attached to a rear surface of the flexible display panel via one or more adhesive films.

In one embodiment, a substrate of the flexible display panel includes a first section of a first thickness and a second section of a second thickness thicker than the first thickness. The second section is provided at an end of the flexible display panel that is located away from the roller.

In one embodiment, the flexible display panel includes a glass substrate and a metal substrate, and the metal substrate having a larger area than the glass substrate.

Embodiments also relate to a rollable display including a flexible display panel, a flexible display panel, a reinforcing structure, a roller, a printed circuit board, a control board, a connecting member and at least one buffer member. The flexible display panel has pixels to display an image on a front side of the flexible display panel. The reinforcing structure is attached to a rear side of the flexible display panel and comprising a plurality of segments. The roller is attached to one end of the flexible display panel and has a circumference surface onto which the flexible display panel is rolled. The printed circuit board is on the flexible display panel. The control board is in the roller. The connecting member connects the control board to the printed circuit board. At least one buffer member is attached to the reinforcing structure.

In one embodiment, the at least one buffer member is a foam tape or a foam board.

In one embodiment, the rollable display further includes an auxiliary sheet between an end of the flexible display panel to couple the flexible display panel to the roller.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Reference will now be made in detail to embodiments illustrated in the accompanying drawings, examples of which are illustrated in the accompanying drawings. Wherever possible, the same reference numbers will be used throughout the drawings to refer to the same or like parts. It will be paid attention that detailed description of known arts will be omitted if it is determined that the arts can mislead the embodiments of the invention. In describing various exemplary embodiments, descriptions of the same or like components will be given in the beginning but omitted in other exemplary embodiments.

Although terms including ordinal numbers such as "first" and "second" may be used to describe various components, the components are not limited by the terms. The terms are used only to distinguish one component from other components.

As an example of an organic light-emitting display, the implementation of a rollable display will be described below according to an exemplary embodiment. However, a flexible display panel for the rollable display is not limited to this example. For example, a rollable display according to the present invention may be implemented based on displays such as a liquid crystal display (LCD), a field emission display (FED), a plasma display panel (PDP), an organic light-emitting display (OLED), an electrophoresis display (EPD), a quantum dot display (QDD), etc.

Figure 1:
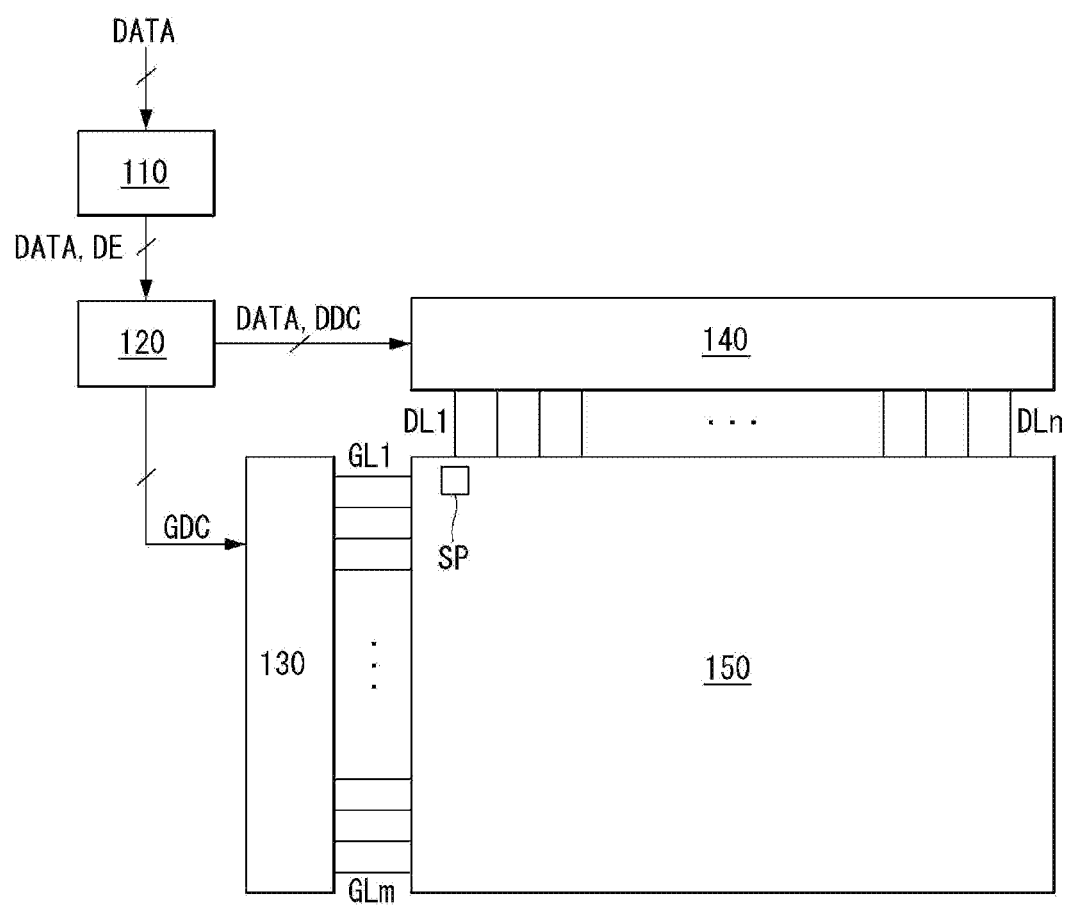
FIG. 1 is a schematic block diagram of an organic light-emitting display according to an exemplary embodiment of the present invention.
Figure 2:
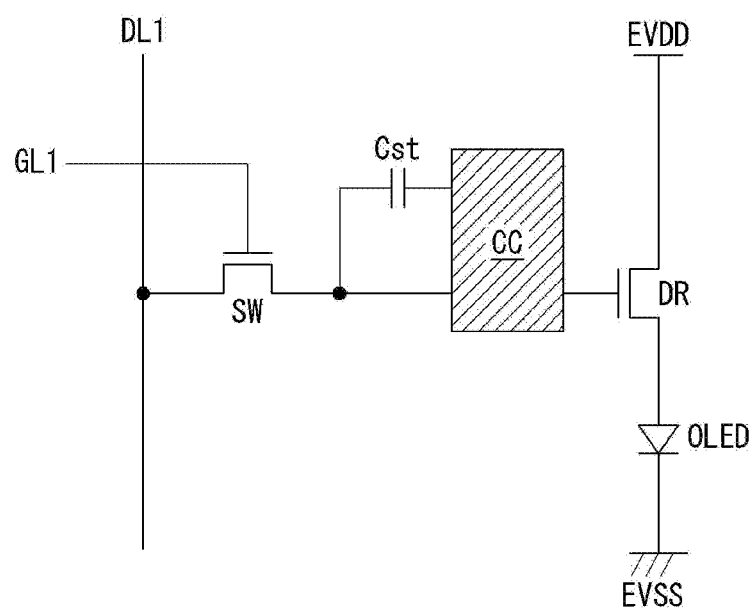
FIG. 2 is a schematic view showing the circuit configuration of a subpixel of FIG. 1.
Figure 3:
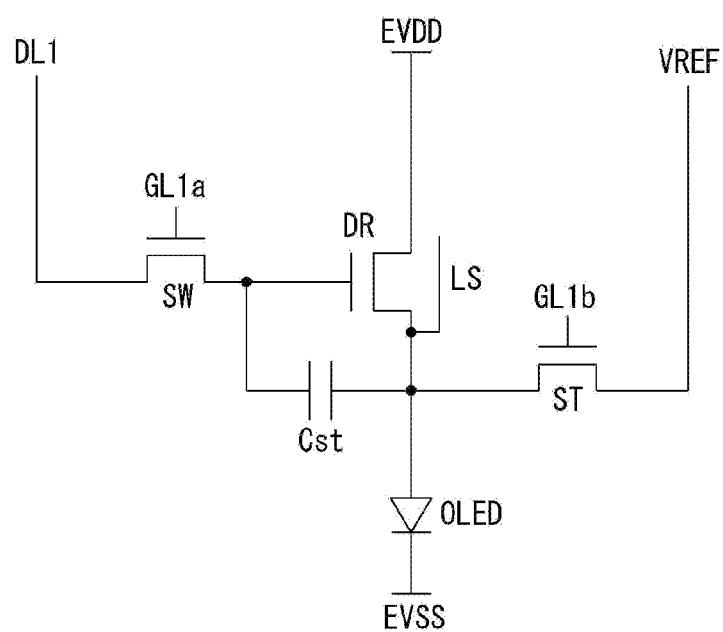
FIG. 3 illustrates an example of the configuration of a subpixel according to an exemplary embodiment of the present invention.

FIG. 1 is a schematic block diagram of an organic light-emitting display according to an exemplary embodiment of the present invention. FIG. 2 is a schematic view showing the circuit configuration of a subpixel of FIG. 1. FIG. 3 illustrates an example of the configuration of a subpixel according to an exemplary embodiment of the present invention.

As illustrated in FIG. 1, an organic light-emitting display according to an exemplary embodiment of the present invention comprises an image processor 110, a timing controller 120, a data driver 140, a scan driver 130, and a flexible display panel 150.

The image processor 110 outputs a data enable signal DE, etc., along with a data signal DATA supplied from the outside. In addition to the data enable signal DE, the image processor 110 may output one or more among a vertical synchronization signal, a horizontal synchronization signal, and a clock signal. But, these signals will not be shown for convenience of explanation.

The timing controller 120 receives the data signal DATA, along with the data enable signal DE or driving signals including a vertical synchronization signal, horizontal synchronization signal, and clock signal, from the image processor 110. The timing controller 120 outputs a gate timing control signal GDC for controlling the operation timing of the scan driver 130 and a data timing control signal DDC for controlling the operation timing of the data driver 140, based on a driving signal.

The data driver 140 samples and latches the data signal DATA supplied from the timing controller 120, in response to the data timing control signal DDC supplied from the timing controller 120, and converts this signal to a gamma reference voltage and outputs it. The data driver 140 outputs the data signal DATA through data lines DL1 to DLn. The data driver 140 may be formed in the form of an IC (integrated circuit).

The scan driver 130 outputs a scan signal while shifting the level of a gate voltage, in response to the gate timing control signal GDC supplied from the timing controller 120. The scan driver 130 outputs a scan signal through scan lines GL1 to GLm. The scan driver 130 is formed in the form of an IC (integrated circuit), or formed on the display panel 150 in the form of a Gate-In-panel.

The flexible display panel 150 displays an image in response to the data signal DATA and scan signal respectively supplied from the data driver 140 and scan driver 130. The flexible display panel 150 comprises subpixels SP that work to display an image.

The subpixels SP may be top-emission type, bottom-emission type, or dual-emission type according to their structure. The subpixels SP may comprise a red subpixel, a green subpixel, and a blue subpixel, or may comprise a white subpixel, a red subpixel, a green subpixel, and a blue subpixel. One or more of the subpixels SP may have a different light-emission area depending on the light-emission characteristics.

As illustrated in FIG. 2, one subpixel comprises a switching transistor SW, a driving transistor DR, a capacitor Cst, a compensation circuit CC, and an organic light-emitting diode OLED.

The switching transistor SW is switched on to store a data signal supplied through the first data line DL1 as a data voltage in the capacitor Cst, in response to a scan signal supplied through the first scan line GL1. The driving transistor DR works to cause a drive current to flow between a first power supply line EVDD and a second power supply line EVSS according to the data voltage stored in the capacitor Cst. The organic light-emitting diode OLED works to emit light by the drive current formed by the driving transistor DR.

The compensation circuit CC is a circuit that is added within the subpixel to compensate a threshold voltage, etc. The compensation circuit CC is made up of one or more transistors. The configuration of the compensation circuit CC varies widely with the method of compensation, an example of which will be described below.

As illustrated in FIG. 3, the compensation circuit CC comprises a sensing transistor ST and a sensing line VREF. The sensing transistor ST is connected between a source line of the driving transistor DR and the anode (hereinafter, sensing node) of the organic light-emitting diode. The sensing transistor ST works to supply a reset voltage (or sensing voltage) passed through the sensing line VREF to the sensing node or to sense the voltage or current at the sensing node.

The switching transistor SW has a first electrode connected to the first data line DL1 and a second electrode connected to a gate electrode of the driving transistor DR. The driving transistor DR has a first electrode connected to the first power supply line EVDD and a second electrode connected to the anode of the organic light-emitting diode OLED. The capacitor Cst has a first electrode connected to the gate electrode of the driving transistor DR and a second electrode connected to the anode of the organic light-emitting diode. The organic light-emitting diode OLED has the anode connected to the second electrode and a cathode connected to the second power supply line EVSS. The sensing transistor ST has a first electrode connected to the sensing line VREF and a second electrode connected to the anode, which is a sensing node, of the organic light-emitting diode OLED. For reference, the first and second electrodes are defined as source and drain electrodes or drain and source electrodes depending on the transistor type.

The operating time of the sensing transistor ST may be similar to or the same as or different from that of the switching transistor SW depending on the compensation algorithm (or the configuration of the compensation circuit). In an example, the switching transistor SW may have a gate electrode connected to a 1*a*-th scan line GL1*a*, and the sensing transistor ST may have a gate electrode connected to a 1*b*-th scan line GL1*b*. In another example, the 1*a*-th scan line GL1*a* connected to the gate electrode of the switching transistor SW and the 1*b*-th scan line GL1*b* connected to the gate electrode of the sensing transistor ST may be connected so that they can be commonly shared.

The sensing line VREF may be connected to the data driver. In this case, the data driver may sense the sensing node of the subpixel and perform compensation according to the sensing result, in real time during a non-display period of an image or an N frame period (N is an integer equal to or greater than 1). Meanwhile, the switching transistor SW and the sensing transistor ST may be turned on at the same time. In this case, a sensing operation through the sensing line VREF and a data output operation for outputting a data signal are distinguished based on the time-division method of the data driver.

A digital data signal, an analog data signal, or a gamma voltage may be compensated according to a sensing result. Also, a compensation circuit that generates a compensation signal (or compensation voltage) based on the sensing result may be implemented within the data driver, within the timing controller, or as a separate circuit.

FIG. 3 illustrates, by way of example, a subpixel with a three-capacitor one-capacitor 3T1C structure which comprises a switching transistor SW, a driving transistor DR, a capacitor Cst, an organic light-emitting diode OLED, and a sensing transistor. Besides, the subpixel may consist of 3T2C, 4T2C, 5T1C, 6T2C, etc., with the addition of a compensation circuit CC.

Organic light-emitting displays require no backlight unit, so the flexible display panel may be made thinner, compared to liquid crystal displays. Moreover, since the organic light-emitting display offers flexibility because of its thinness, the flexible display panel can be bent or curved and the shape of the flexible display panel can be changed by rolling and unrolling it like a scroll. For this reason, more and more attempts are being made to design the flexible display panel of the organic light-emitting display and a machine structure for holding it in various shapes.

Now, the structure of a flexible display panel that can be rolled and unrolled like a scroll to realize a rollable display panel will be described.

Figure 4:
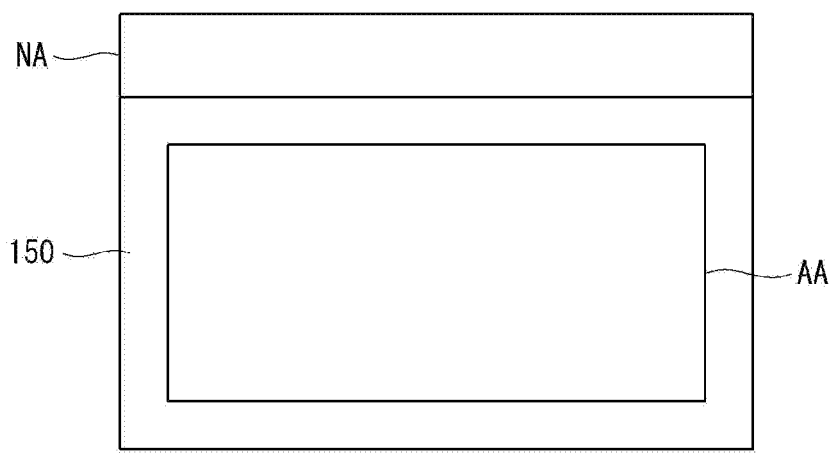
FIG. 4 illustrates the top plane of a flexible display panel according to an exemplary embodiment of the present invention.
Figure 5:
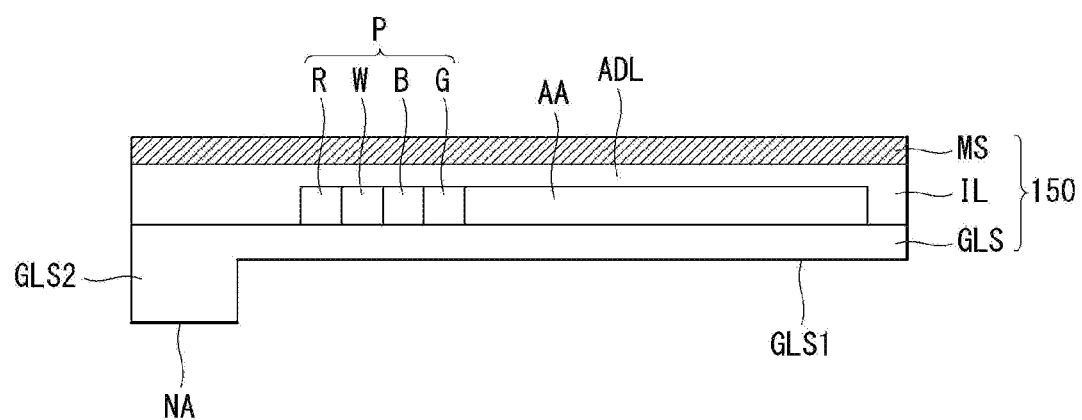
FIG. 5 illustrates a cross-section of the flexible display panel according to the exemplary embodiment of the present invention.
Figure 6A:
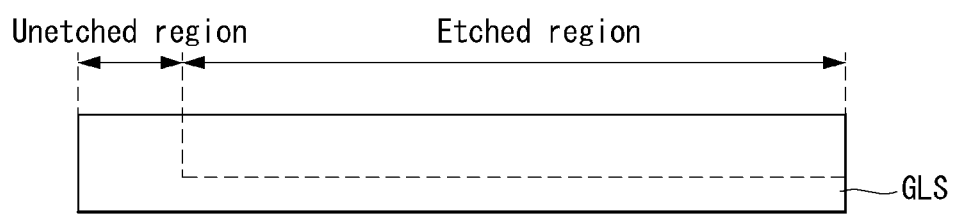
FIGS. 6A and 6B are cross-sectional views showing an example of etching a first substrate.
Figure 6B:
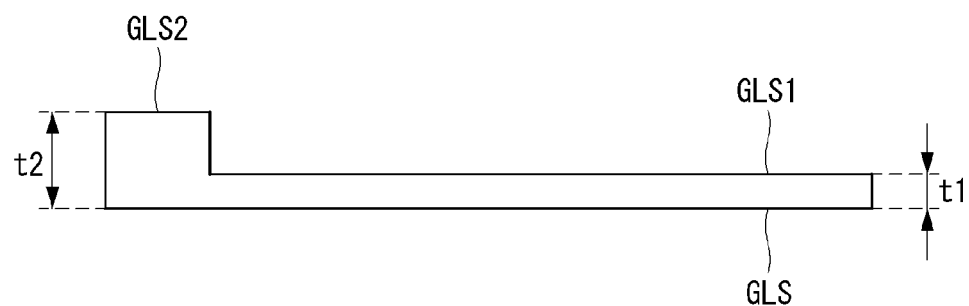
Figure 7:
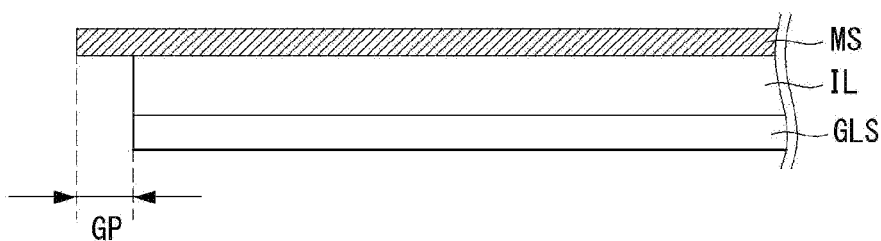
FIG. 7 is a cross-sectional view showing an example of joining a first substrate and a second substrate, according to one embodiment.
Figure 8:
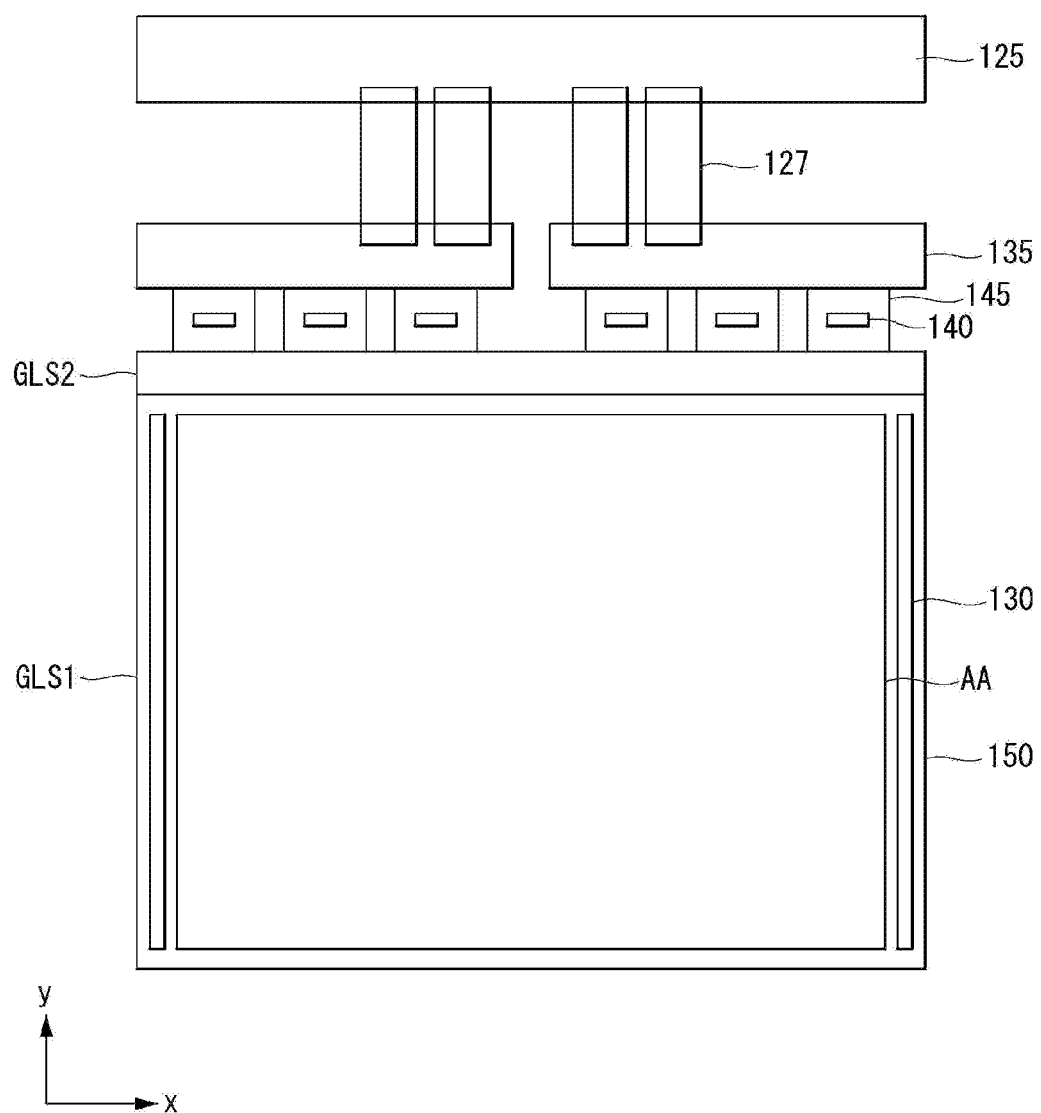
FIG. 8 is a top plan view showing a flexible display panel implemented as a module.

FIG. 4 illustrates the top plane of a flexible display panel according to an exemplary embodiment of the present invention. FIG. 5 illustrates a cross-section of the flexible display panel according to the exemplary embodiment of the present invention. FIGS. 6A and 6B are cross-sectional views showing an example of etching a first substrate. FIG. 7 is a cross-sectional view showing an example of joining the first substrate and a second substrate together. FIG. 8 is a top plan view showing a flexible display panel implemented as a module.

As illustrated in FIGS. 4 through 8, the flexible display panel 150 according to the exemplary embodiment of the present invention comprises a first substrate GLS, an intermediate layer IL having a display area AA. The display area AA includes a plurality of pixels P, and a second substrate MS.

The intermediate layer IL has an adhesion layer ADL, along with the pixels P constituting the display area AA. The pixels P may be made up of subpixels that emit light of red (R), white (W), blue (B), and green (G), but are not limited to them. The adhesion layer ADL is made of an adhesive material that facilitates the joining of the first substrate GLS and the second substrate MS and seals the intermediate layer IL located between the first substrate GLS and the second substrate MS.

The first substrate GLS is made of glass or resin. The first substrate GLS may have a thickness of 0.01 mm to 0.2 mm. A test result showed that, if the first substrate GLS is thin with a thickness of 0.01 mm to 0.1 mm, this makes it very easy to change the shape by rolling and unrolling it like a scroll.

The first substrate GLS has an etched region (or first thickness portion) GLS1 and an unetched region (or second thickness portion) GLS2. The unetched region GLS2 is formed where a pad portion for connecting to an external substrate is provided. The unetched region GLS2 is in the shape of a rectangle which is horizontally long. The unetched region GLS2 is provided to increase the rigidity of the area connected to the external substrate. Due to the shape of GLS2, the unetched region GLS2 may take up only 1 to 2% of the entire area of the first substrate GLS. Also, the thickness t2 of the unetched region GLS2 may range from 0.5 mm to 0.7 mm.

The rest of the first substrate GLS, except for the unetched region GLS2, is all removed by an etching process, etc., and becomes the etched region GLS1. The etched region GLS1 is provided to mitigate the tensile stress that the first substrate GLS may be subjected to when the flexible display panel 150 is rolled and unrolled like a scroll. Hence, the thickness t1 of the etched region GLS1 may range from 0.01 mm to 0.1 mm.

The second substrate MS is made of metal. The thickness of the second substrate MS may range from 0.01 mm to 0.2 mm. The second substrate MS serves to absorb, distribute, and mitigate the tensile stress that the first substrate GLS may be subjected to when the flexible display panel 150 is rolled or unrolled like a scroll. A test result showed that, if the first substrate GLS is thin with a thickness of 0.01 mm to 0.2 mm, it is possible to efficiently absorb, distribute, and mitigate the tensile stress that the first substrate GLS may be subjected to when the flexible display panel 150 is rolled or unrolled like a scroll.

The second substrate MS has better resistance to impacts compared to the first substrate GLS since it is made of metal. Hence, the second substrate MS may be made larger than the first substrate GLS. That is, the second substrate MS may have at least one protruding part GP that protrudes outwards further than the first substrate GLS1 as illustrated in FIG. 7. The protruding part GP of the second substrate MS may serve to efficiently protect fragile parts like the corners from impacts the first substrate GLS may be subjected to.

Meanwhile, the flexible display panel 150 is electrically connected and attached to the timing controller 120, data driver 140, scan driver 130, etc. (the image processor, a power supply part, etc. are not shown), and implemented as a module as shown in FIG. 8.

The scan driver 130 may be formed on the flexible display panel 150 by Gate In Panel (GIP) technology. That is, the scan driver 130 may be formed on the flexible display panel 150 may be formed by GIP technology on the left side, right side, or both the left and right sides of the display area AA so that the flexible display panel 150 can be rolled like a scroll. However, the present invention is not limited to this.

A data printed circuit board (hereinafter, "data PCB") 135 is electrically connected to the flexible display panel 150 through a first connecting member 145. The first connecting member 145 may be, but not limited to, a Chip On Film (COF) with the data driver 140 mounted on it. For example, the first connecting member 145 may be implemented by Tape Carrier Package (TCP) technology and electrically connect the data PCB 135 and the flexible display panel 150. To prevent or reduce the likelihood that the data PCB 135 is damaged due to repeated stress due to rolling and unrolling, it is advantageous to place the data PCB 135 at an end of the flexible display panel 150 further away from the roller 160.

The data PCB 135 is connected to a control board 125 through a second connecting member 127. A plurality of second connecting members 127 may be provided. The timing controller 120, etc. is mounted on the control board 125. The second connecting member 127 may be, but not limited to, a Flexible Flat Cable (FFC). The control board 125 may be connected to the image processor 110, the power supply part, etc. by a connecting cable to transmit signals and power for displaying images on the flat display panel 150.

The structure of a mechanical structure for realizing a rollable display will now be described.

Figure 9A:
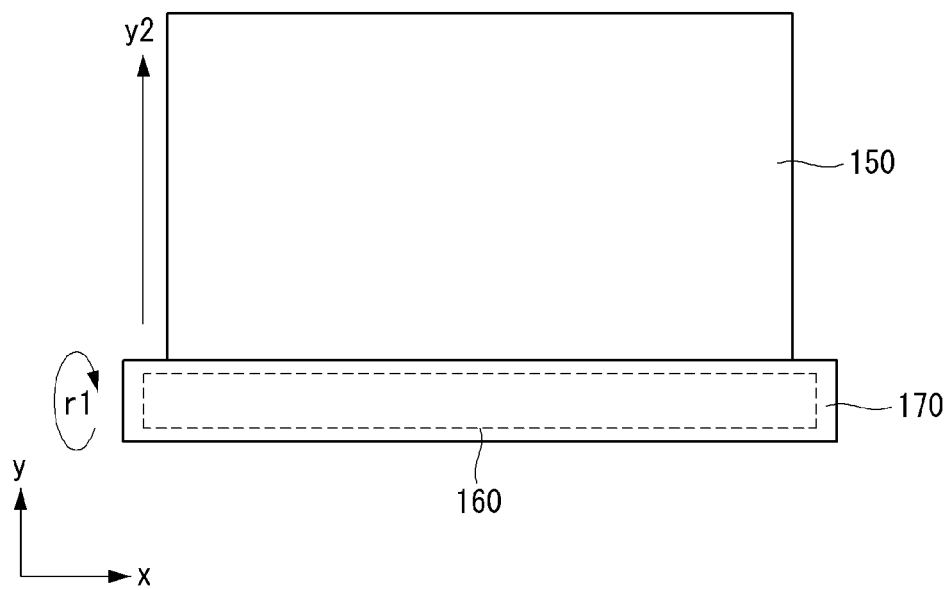
FIGS. 9A and 9B are views showing a rollable display according to an exemplary embodiment of the present invention.
Figure 9B:
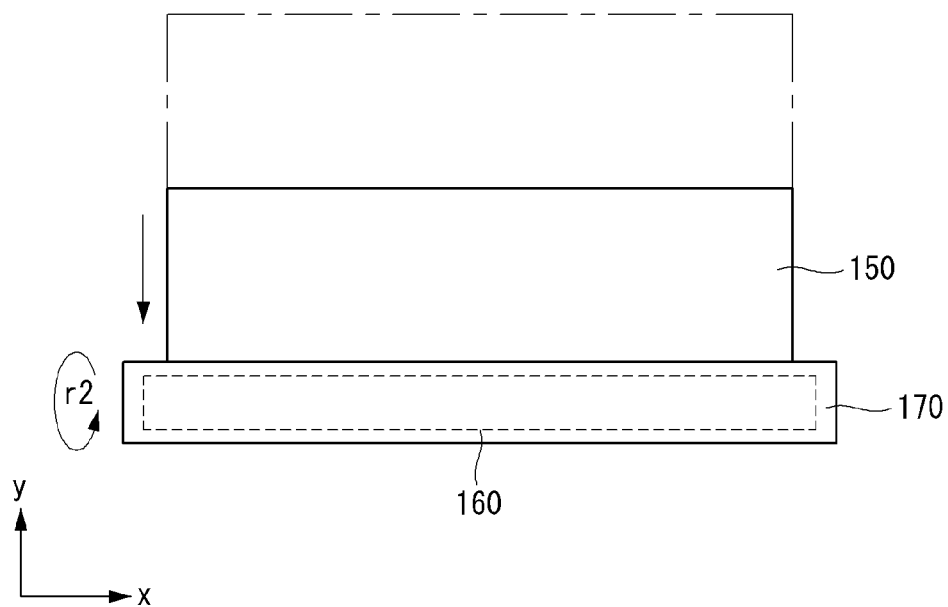
Figure 10:
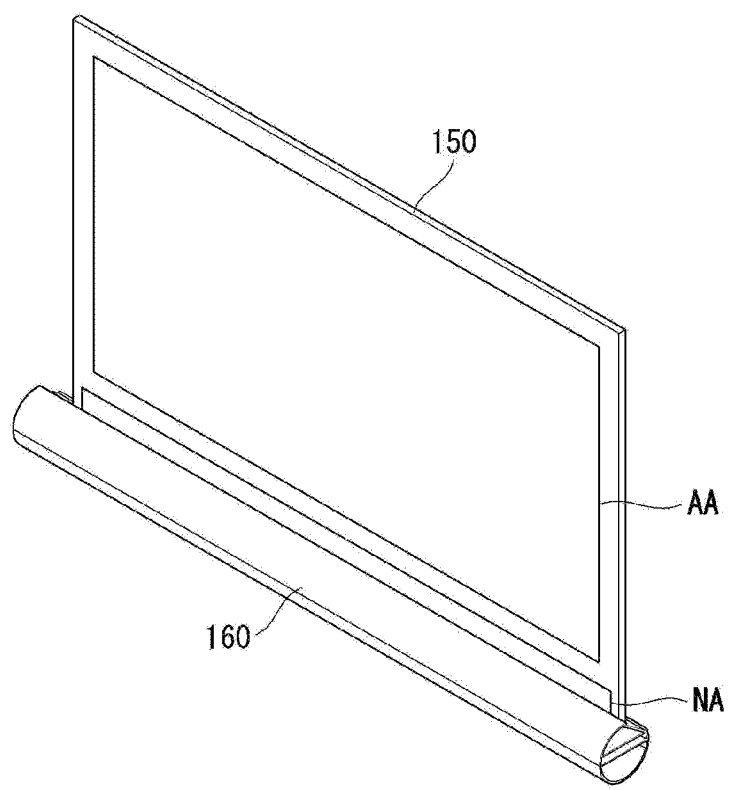
FIG. 10 is a perspective view showing a flexible display panel and a roller.

FIGS. 9A and 9B are views showing a rollable display according to an exemplary embodiment of the present invention. FIG. 10 is a perspective view showing a flexible display panel and a roller.

As illustrated in FIGS. 9A through 10, the rollable display according to the exemplary embodiment of the present invention comprises a flexible display panel 150 implemented as a module (hereinafter, abbreviated as "flexible display panel"), a roller 160, and a retractable portion 170.

The roller 160 provides a mechanical structure that allows the flexible display panel 150 to be rolled up around its circumference surface and unrolled from it. The roller 160 is accommodated in the retractable portion 170.

The retractable portion 170 can accommodate the flexible display panel 150 and the roller 160. A driving device, such as a motor, a gear, a power source, etc. for electrically rotating the roller 160 may be included within the retractable portion 170. As such, the retractable portion 170 may be designed to be circular, elliptical, rectangular, or polygonal in shape according to the configuration or design of the driving device.

The flexible display panel 150 comes out of the retractable portion 170 or goes into the retractable portion 170 depending on the direction of rotation of the driving device. For example, when the driving device rotates in the r1 direction, the roller 160 allows the flexible display panel 150 to be unrolled. In this case, the flexible display panel 150 moves in the y2 direction, coming out of the retractable portion 170. By contrast, when the driving device rotates in the r2 direction, the roller 160 allows the flexible display panel 150 to be rolled. In this case, the flexible display panel 150 moves in the y1 direction and goes into the retractable portion 170.

Figure 11A:
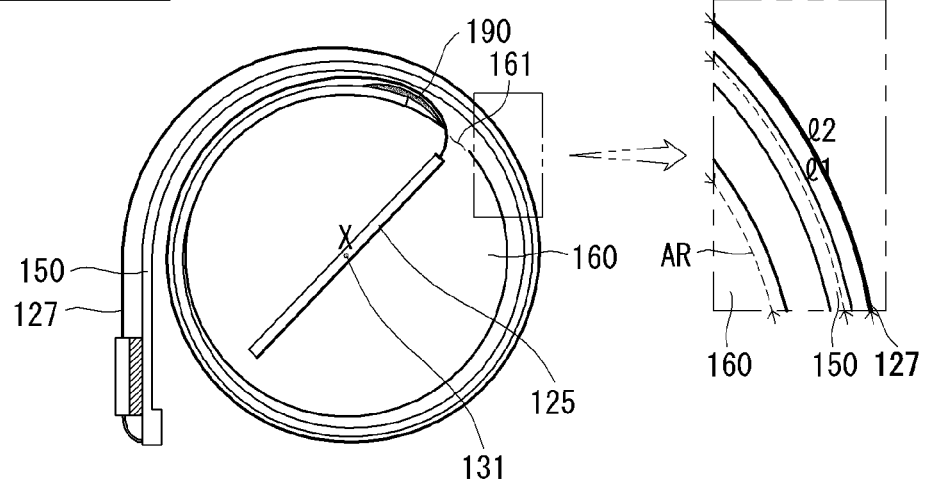
FIGS. 11A through 12 are views for explaining the basic structure of the rollable display panel.
Figure 11B:
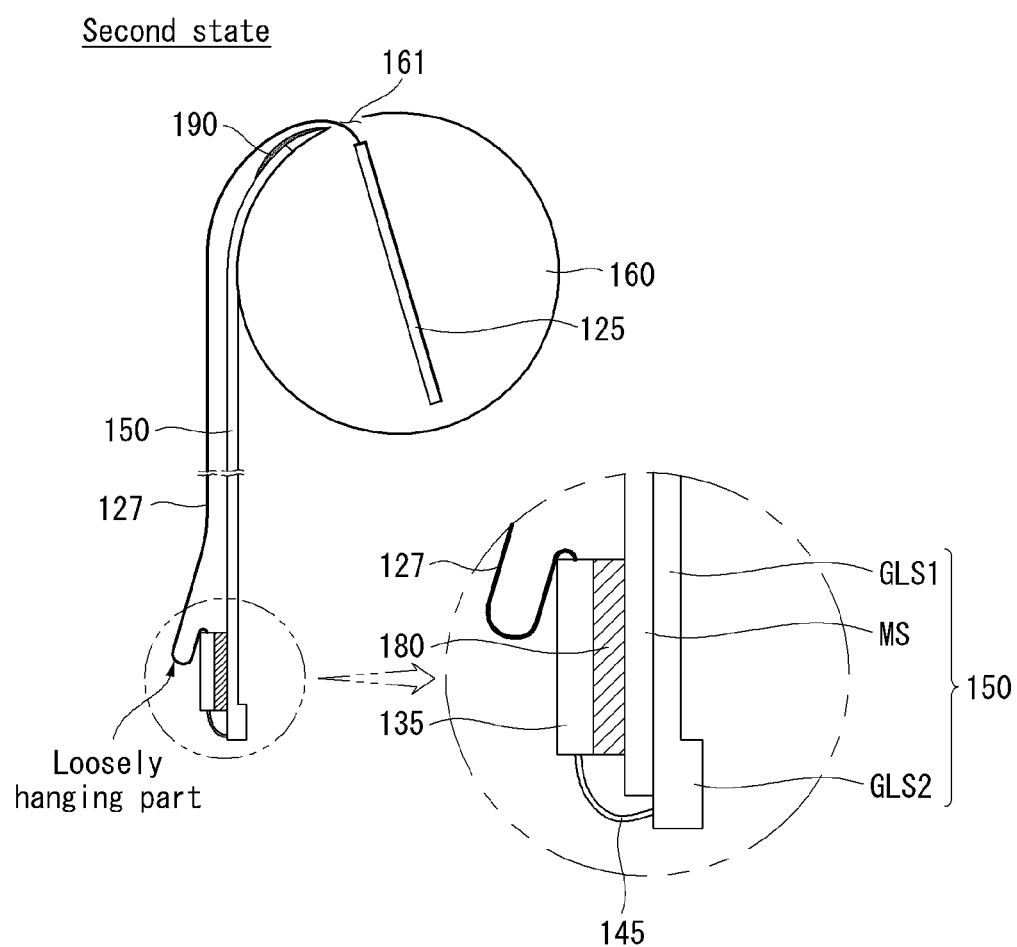
Figure 12:
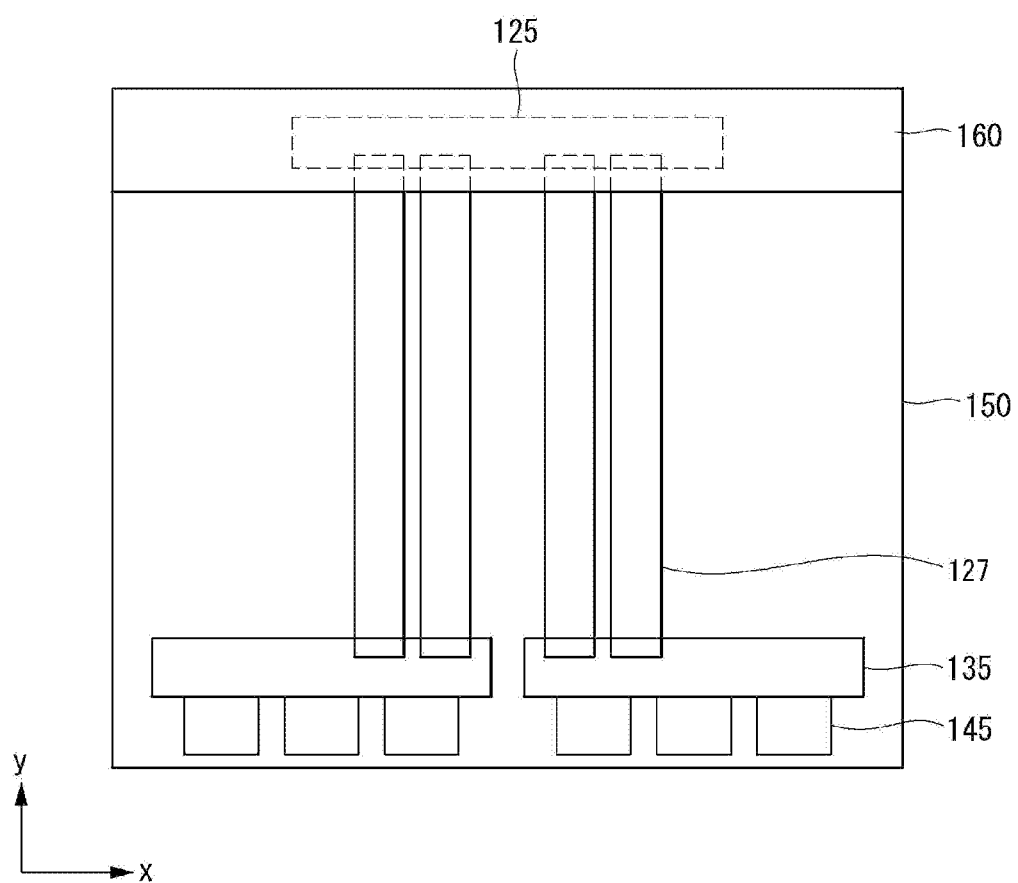

The structure of the rollable display will be described below with reference to FIGS. 11 and 12. FIGS. 11A through 12 are views for explaining the basic structure of the rollable display panel.

Referring to FIGS. 11A through 12, the rollable display according to the present invention comprises a roller 160, a control board 125, a flexible display panel 150, and a data PCB 135.

The roller 160 may be approximately cylindrical. That is, a cross-section of the panel roller 150 may be circular. However, the roller 150 is not limited to this shape, but may take any shape as long as the flexible display panel 150 can be rolled up with ease. The roller 160 rotates about an axis 131 that extends in a longitudinal direction of the roller (in the direction of x axis).

The roller 160 may have an internal space for accommodating the control board 125. The internal space may further have a stationary structure for fixing the control board 125. The stationary structure may be provided on the inside of the roller 160 and fix the control board 125 to prevent the control board 125 from falling out and colliding with other structures. This means that the movement of the control board 125 may be restrained and restricted within the roller 160.

The rollable display according to the present invention can improve space utilization since the control board 125 is embedded in the roller 160 and give the user aesthetic pleasure since the control board 125 is not visible from the outside.

The roller 160 further comprises a slit 161 that opens to the internal space accommodating the control board 125. That is, the slit 161 is an open part of the roller 160, and functions as a path connecting the control board 125 accommodated in the roller 160 to external structures like the data PCB 135.

The flexible display panel 150 comprises a display area where an input image is displayed. The user may recognize information output from the flexible display panel 150 through the display area. The front side of the flexible display panel 150 is one side of the flexible display panel 150 where the display area is defined. By contrast, the rear side of the flexible display panel 150 is the side opposite to the front side of the flexible display panel, where the display area is not visible to the user.

The flexible display panel 150 may be rolled up around the roller 160. That is, the rollable display according to the present invention allows the flexible display panel 150 to be repeatedly rolled around or unrolled from the circumference of the roller 160 easily.

The flexible display panel 150 may be rolled around or unrolled from the roller 160 and maintain a first state or second state. The first state may refer to the state in which the flexible display panel 150 is rolled around the roller 160. In the first state, the display area on the flexible display panel 150 is not exposed to the outside so that the display area is not visible to the user. In the first state, the display area of the flexible display panel 150 and the outside surface of the roller 160 may be opposite each other. In the first state, the display device may be turned off so that no input image is displayed.

The second state may refer to the unrolled state of the flexible display panel 150. In the second state, the flexible display panel 150 may remain approximately flat. In the second state, the display area on the flexible display panel 150 is visible to the user. In the second state, the display device may be turned on so that an input image is displayed.

If required, the flexible display panel 150 may change from the first state to the second state or from the second state to the first state. Changes in the state of the flexible display panel 150 may be caused by physical external forces provided directly by the user. The changes in the state of the flexible display panel 150 may be controlled by a control part, in response to a predetermined signal. The rolling up of the flexible display panel 150 may be controlled by a selected driving device, driving circuit, etc.

One end of the flexible display panel 150 is fixed to the roller 160. To fix them, a bonding member or fixing member may be further provided between one end of the flexible display panel 150 and the roller 160.

In another embodiment, the flexible display panel 150 is connected to an auxiliary sheet 190 that is secured to the roller 160 at location 176 next to or near slit 161. That is, the flexible panel 150 is not directly connected to the roller 160 but is connected via the auxiliary sheet 190 to the roller 160. The auxiliary sheet 190 is a flexible sheet with a higher strength and durability than the flexible panel 150. When the flexible panel 150 is fully unrolled from the roller 160, the flexible panel 150 does not contact the circumference surface of the roller 160 and the flexible panel 150 hangs from the roller 160 via the auxiliary sheet 190. The auxiliary sheet 190 can have enough rigidity so that the end portion of the flexible display panel 150 connected to the auxiliary sheet 190 is bent with a larger radius of curvature onto the roller 160 (with a slight gap between the edge of the flexible panel 150 and the roller 160) to mitigate the mechanical stress at the edge of the flexible display panel 150 when the flexible display panel 150 is rolled around the roller 160.

The unetched region GLS2 is located on the other end of the flexible display panel 150 which is not bonded to the roller 160. The unetched region GLS2 protrudes outwards further than the etched region GLS1 since it extends from the etched region GLS1 and is thicker than the etched region GLS1.

Due to this, when the flexible display panel 150 changes its state, mechanical problems such as collision or friction may occur between the unetched region GLS2 and other mechanical structures. For example, when the flexible display panel 150 changes from the second state to the first state, the etched region GLS2 may collide with the roller 160, resulting in a mechanical or electrical defect. To prevent this, the unetched region GLS2 is located not where the flexible display panel 150 starts to roll around the roller 160, but on the opposite side. This means that the unetched region GLS2 is preferably located on the other end of the flexible display panel 150 which is not fixed directly to the roller 150. The other end of the flexible display panel 150 where the unetched region GLS2 is located may be a non-rollable area which cannot be rolled around the roller 160.

The data printed circuit board 135 is electrically connected to the flexible display panel 150 through the first connecting member 145. One end of the first connecting member 145 may be bonded to the rear side of the unetched region GLS2, and the other end may be bonded to the data PCB 135. The data PCB 135 is electrically connected to the control board 125 through a second connecting member 127.

The data PCB 135 may be located on the rear side of the flexible display panel 150. This means that the data PCB 135 is not in the user's field of vision. The data PCB 135 may be fixed to the rear side of the flexible display panel 150. The data PCB 135 may be fixed to the rear side of the flexible display panel 150 via a fixing member 180 so that its movement can be restrained and restricted. The fixing member 180 may include an adhesive such as double-sided tape.

The second connecting member 127 passes through the slit 161 of the roller 160, and electrically connects the control board 125 mounted inside the roller 160 and the data PCB 135 provided on the outside of the roller 160. The second connecting member 127 is provided on the rear side of the flexible display panel 150. This means that the second connecting member 127 is not in the field of vision of the user who is viewing an image displayed on the font side of the flexible display panel 150. The rollable display according to the present invention may comprise at least one second connecting member 127 if necessary. Although the figure illustrates four second connecting members by way of example, the present invention is not limited to this.

The second connecting member 127 works in conjunction with a change in the state of the flexible display panel 150. If the flexible display panel 150 is in the first state, the second connecting member 127 may remain in the first state. If the flexible display panel 150 is in the second state, the second connecting member 127 may remain in the second state.

In the first state, the second connecting member 127 remains rolled up around the roller 160, along with the flexible display panel 150. In the second state, the second connecting member 127 remains unrolled, along with the flexible display panel 150. In the second state, the side of the second connecting member 127 may be flat in some parts, and may be deformed in some parts due to its flexibility. The deformed shape of the side may refer to a non-flat, curved shape.

When the flexible display panel 150 changes from the first state to the second state, the second connecting member 127 also changes from the first state to the second state. When the flexible display panel 150 changes from the second state to the first state, the second connecting member 127 also changes from the second state to the first state.

In conjunction with the rolling up (or a change in the state) of the flexible display panel 150, the second connecting member 127 located at the rear side of the flexible display panel 150 performs a rolling operation around the roller 160 which is located on the front side of the flexible display panel 150 with the flexible display panel 150 between the second connecting member 127 and the roller 160.

Since the second connecting member 127 is rolled with the flexible display panel 150 between the second connecting member 127 and the roller 160, cracking or disconnection may occur on the second connecting member 127 if the flexible display panel 150 covering a particular area of the roller 160 and the second connecting member 127 are the same length in the first state.

To prevent this, the rollable display according to the present invention is configured in such a way that the length L1 of the flexible display panel 150 corresponding to a particular area AR of the roller 160 and the length L2 of the second connecting member 127 are different from each other. That is, the rollable display according to the present invention ensures that the second connecting member 127 is long enough compared to the length of the flexible display panel 150, in order to prevent the above-mentioned problem. This means that the second connecting member 127 may not be able to remain flat even while the flexible display panel 150 remains flat. With the second connecting member 127 being long enough, the rollable display according to the present invention can compensate for the length difference between the flexible display panel 150 and the second connecting member 127 that occurs due to the rolling operation.

As the second connecting member 127 is made long enough compared to the flexible display panel 150, the second connecting member 127 may be curved and stick out too much in some areas and hang loose in the direction of gravitational force. The loosely-hanging part of the second connecting member 127 may be placed relatively close to other structural parts, and the second connecting member 127 may be damaged by friction or collision with the structural parts placed close to it.

Moreover, the second connecting member 127 and the flexible display panel 150 may be bent or flexed by stress from repeated rolling operations and/or impact from the outside. Accordingly, damage such as cracking may occur on the flexible display panel 150.

First Exemplary Embodiment

Now, a rollable display according to a first exemplary embodiment of the present invention will be described with reference to FIGS. 13 through 18. FIGS. 13 through 18 are views for explaining a first exemplary embodiment of the present invention.

Figure 13:
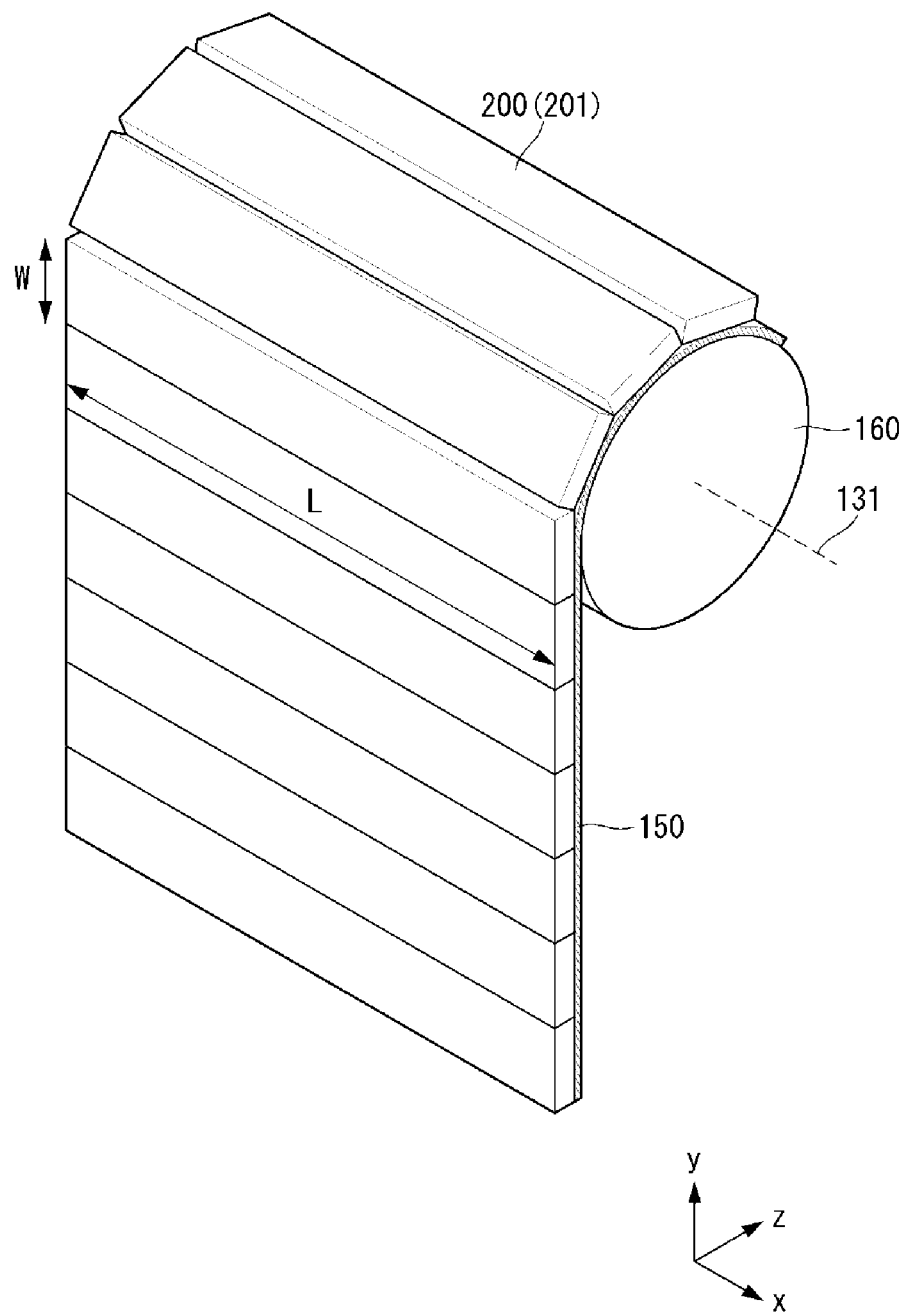
FIGS. 13 through 18B are views for explaining a first exemplary embodiment of the present invention.
Figure 14:
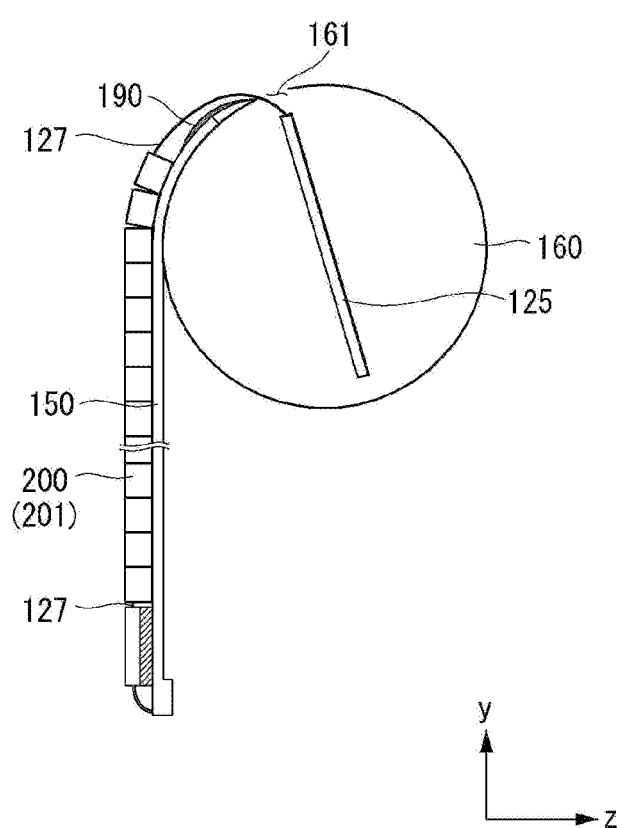

Referring to FIGS. 13 and 14, the rollable display according to the first exemplary embodiment of the present invention further comprises a reinforcing structure 200 that supports the rear side of the flexible display panel 150. The reinforcing structure 200 is provided on the rear side of the flexible display panel 150, and supports the rear side of the flexible display panel 150 and reinforces the rigidity of the flexible display panel 150. The reinforcing structure 200 may comprise a material which is lightweight and has high strength. For example, the reinforcing structure 200 may comprise either aluminum, plastic, or wood.

The reinforcing structure 200 is provided on the rear side of the flexible display panel 150, and may be attached directly to the rear side of the flexible display panel 150. The reinforcing structure 200 may be bonded to the rear side of the flexible display panel 150 by an adhesive means such as double-sided tape. The reinforcing structure 200 may be provided to correspond to the entire area of the rear side of the flexible display panel 150, or may be provided in some area that needs to be reinforced.

The reinforcing structure 200 comprises n (n is a positive integer greater than or equal to 2) discrete segments 201. Each segment 201 may have the shape of a bar that extends in a first direction (e.g., x direction). Each segment 201 may be, but not limited to, approximately hexagonal. The segments 201 are arranged side by side in a second direction (e.g., y direction) perpendicular to the first direction.

The length L of the segments 201 along the first direction may be equal to or greater than the length of the flexible display panel 150 along the first direction. This means that the edges of the flexible display panel 150 which are fragile to external impact can be protected sufficiently. Moreover, if the length of the segments 201 along the first direction is equal to the length of the flexible display panel 150 along the first direction, this can give the user aesthetic pleasure. Although not shown, the length of one of the segments 201 along the first direction may be different from the length of another segment 201.

The width W of the segments 201 along the second direction may be properly determined corresponding to the amount of curvature applied when the flexible display panel 150 changes its state. This means that the width W of each segment 201 along the second direction may be related to the curvature of the flexible display panel 150 at the corresponding position. In an example, if the curvature of the flexible display panel 150 at the corresponding position in the first state is large, it may be desirable that the width W of the segment 201 along the second direction is relatively short. The width W of segments 201 along the second direction may be shorter than the radius of the roller 160, the material of the segments 201, etc. Although not shown, the length L of one of the segments 201 along the first direction may be different from the length of another segment 201.

In one embodiment, each of the segments 201 is attached to the flexible display panel 150 via one or more adhesive films. A single adhesive film may span across an entire rear surface of the flexible display panel 150 or multiple adhesive films may be placed at locations where the segments are to be secured to the flexible display panel 150.

Figure 15A:
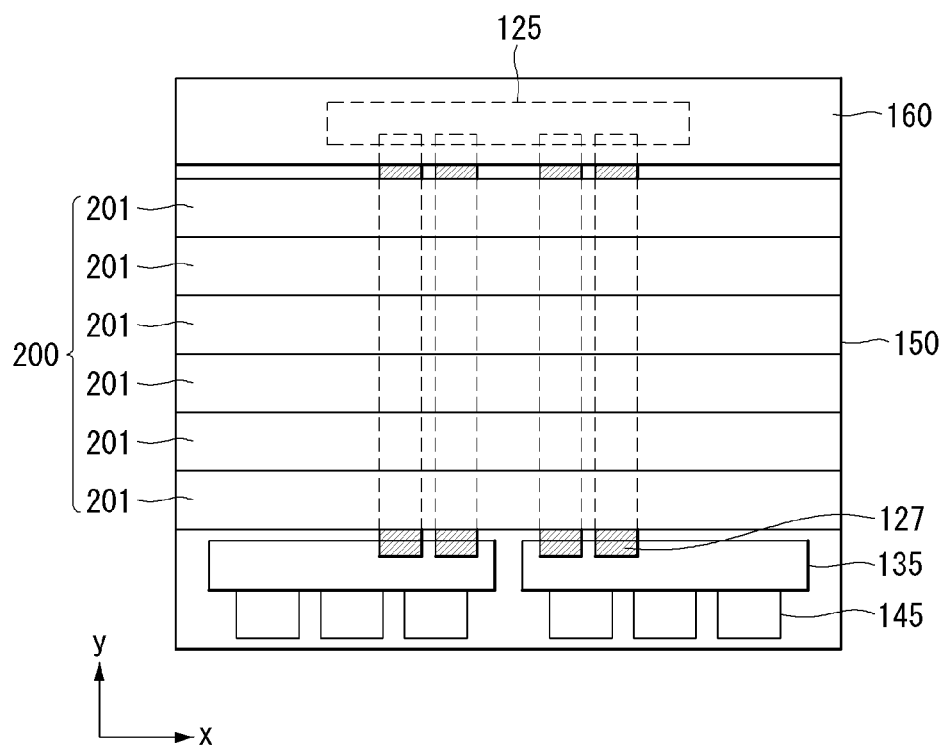
Figure 15B:
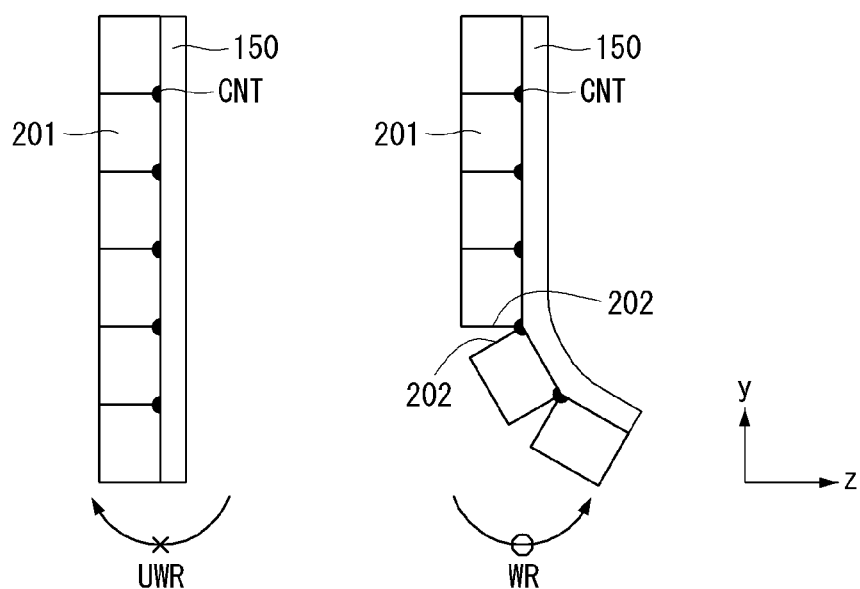

Referring further to FIGS. 15A and 15B, the segments 201 may be arranged side by side in the second direction, with no gaps in between. In this case, adjacent segments 201 may be connected together through a hinge CNT. A segment 201 in the second state may rotate only in the rolling direction WR of a segment 201 next to it (or toward the front of the flexible display panel 150).

Specifically, when an external force is exerted to the reinforcing structure 200 in the second state in a direction UWR opposite to the rolling direction, the side surfaces 202 of adjacent segments 201 come into contact with each other, so the movements of the segments 201 are restricted. This means that the flexible display panel 150 may remain flat in the second state. Also, this can prevent rotations in an unwanted direction UWR (or toward the rear of the flexible display panel 150) when the flexible display panel 150 is in the second state.

When an external force is exerted to the reinforcing structure 200 in the second state in the rolling direction WR, a state change to the first state occurs. This means that the flexible display panel 150 can change from the second state to the first state.

In the first exemplary embodiment of the present invention, it is possible to prevent the flexible display panel 150 from rolling in an unwanted direction by the operation of the reinforcing structure 200. That is, the first exemplary embodiment of the present invention may provide a rollable display which offers greater convenience for users by allowing the flexible display panel 150 to remain flat, as well as to be rolled around the roller 160.

By comprising the reinforcing structure 200, the first exemplary embodiment of the present invention can reinforce the rigidity of the flexible display panel 150 and efficiently absorb, distribute, and mitigate external forces, thereby minimizing damage to the flexible display panel 150 due to external forces. Accordingly, the first exemplary embodiment of the present invention can provide a rollable display which offers greater product reliability.

Figure 16A:
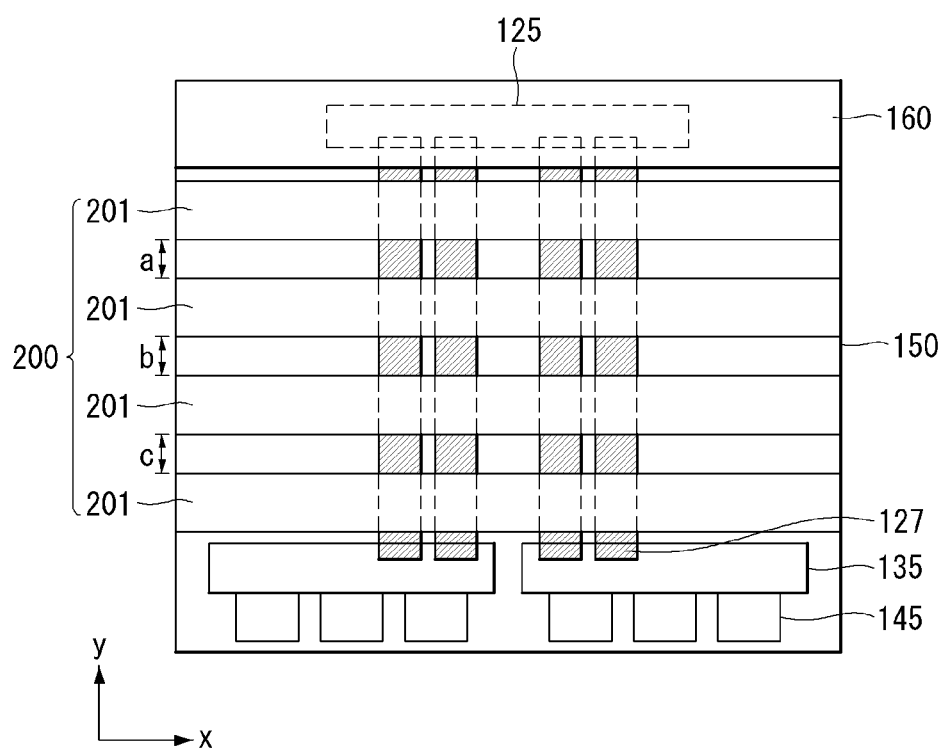
Figure 16B:
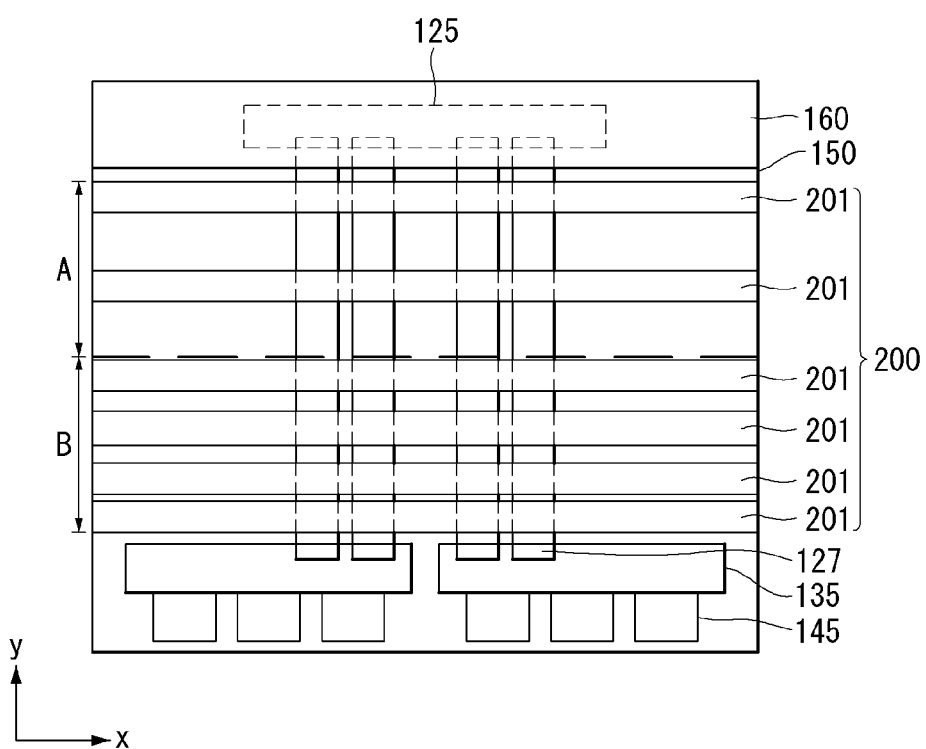

Referring further to FIG. 16A, adjacent segments 201 may be spaced apart by a set distance and arranged side by side in the second direction. The distance a, b, and c between the adjacent segments 201 may vary with location. This means that the segments 201 may be selectively placed at specific locations. Also, the density of the segments 201 may vary with location. For example, assuming that the rear side of the flexible display panel 150 is divided into virtual A and B regions each having the same area, more segments 201 may be placed in the B region than in the A region, as shown in FIG. 16B. The B region is the region to which more external force is applied that may be vulnerable to cracking.

In the first exemplary embodiment of the present invention, the rigidity of the flexible display panel can be reinforced as much as is required by using a relatively small number of segments 201. Accordingly, the first exemplary embodiment of the present invention provides a rollable display which is relatively lightweight, as well as reinforcing the rigidity of the flexible display panel 150. Also, the first exemplary embodiment of the present invention provides a rollable display which allows for a greater degree of design freedom since the locations of the segments 201 may vary as needed.

Figure 17:
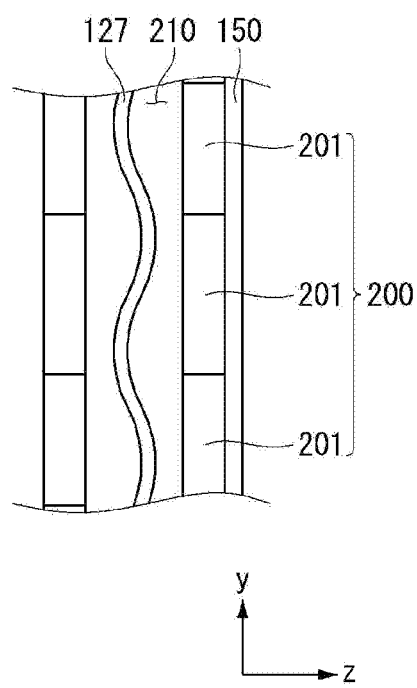
Figure 18A:
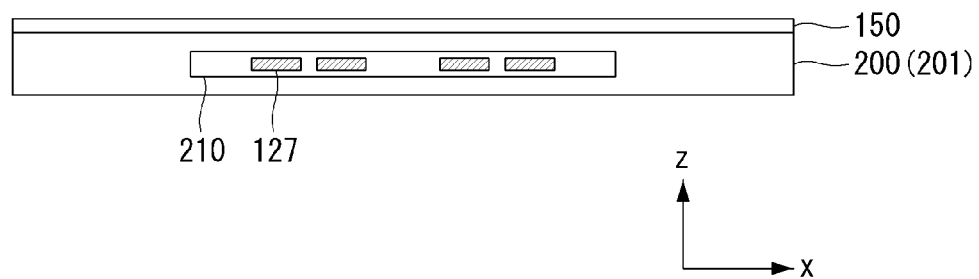
Figure 18B:
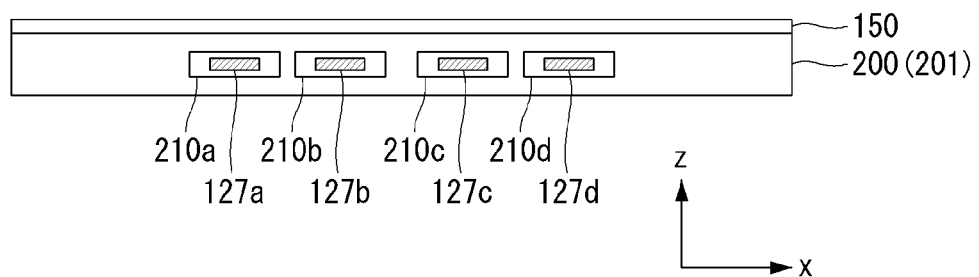

Referring further to FIGS. 17 and 18, the reinforcing structure 200 comprises a through hole 210 that opens and traverses in the second direction. At least part of the second connecting member 127 is located within the through hole 210. This means that the second connecting member 127 may pass through the inside of the reinforcing structure 200 and extend in the second direction. In conjunction with a change in the state of the flexible display panel 150, the second connecting member 127 rolls around or unrolls from the roller 160 and slides inside the through hole 210 of the reinforcing structure 200.

The reinforcing structure 200 functions as a mechanical structure for supporting the second connection member 127 and keeps the second connecting member 127 from hanging loose. That is, in the first exemplary embodiment of the present invention, it is possible to mitigate and distribute how much the second connecting member 127 hangs loose by accommodating the second connecting member 127 in the through hole 210 of the reinforcing structure 200, in order to prevent the second connecting member 127 from hanging too loose in some areas. This means that unidirectional movement of the second connecting member 127 accommodated in the reinforcing structure 200 may be restricted by the space provided inside the through hole 210 of the reinforcing structure 200.

More specifically, the reinforcing structure 200 comprises a plurality of segments 201, and each segment 201 has a through hole 210. The second connecting member 127, inserted into each segment 201 through the through hole 210, is free to move in a lengthwise direction (e.g., y direction) of the through hole 210, in conjunction with a change in the state of the flexible display panel 150, but its movement along the width (e.g., x direction), perpendicular to the lengthwise direction may be restricted by the limited space inside the through hole 210.

The second connecting member 127 may remain flat within the space provided inside the through hole 210 and take a curved shape unless it hangs too loose. The second connecting member 127 may have a relatively large radius of curvature within the space provided in the through hole 210.

As such, in the first exemplary embodiment of the present invention, a plurality of segments 201 may be provided so that the second connecting member 127 can be distributed in spaces provided in the through holes 210 of the segments 201. Accordingly, it is possible to prevent the second connecting member 127 from hanging too loose at a specific location. Moreover, the first exemplary embodiment of the present invention can provide a rollable display which offers greater product reliability by reducing damage to the second connecting member 127 caused by contact with external structures.

The number of through holes 210 in the reinforcing structure 200 may correspond to the number of second connecting members 127. That is, the rollable display may comprise m second connecting members 127 (m is a positive integer equal to or greater than 1), and the m second connecting members 127 may be respectively inserted into different through holes 201. The first exemplary embodiment of the present invention can reduce signal interference that may occur between adjacent connecting members, by accommodating the second connecting members 127 in different discrete through holes 210. Accordingly, the first exemplary embodiment of the present invention can provide a rollable display which reduces operational defects.

Second Exemplary Embodiment

Now, a rollable display according to a second exemplary embodiment of the present invention will be described with reference to FIG. 19. FIG. 19 is a view for explaining a second exemplary embodiment of the present invention.

Figure 19A:
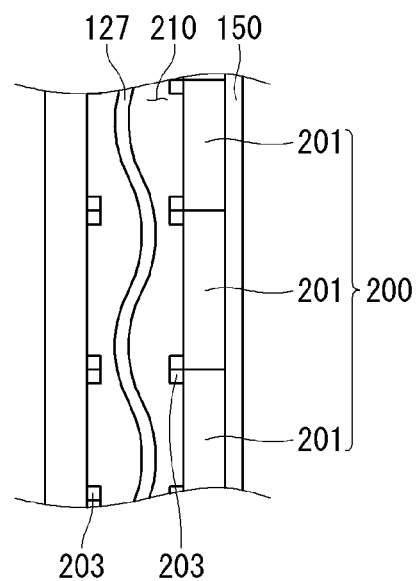
FIGS. 19A and 19B is a cross-sectional view for explaining a second exemplary embodiment of the present invention.
Figure 19B:
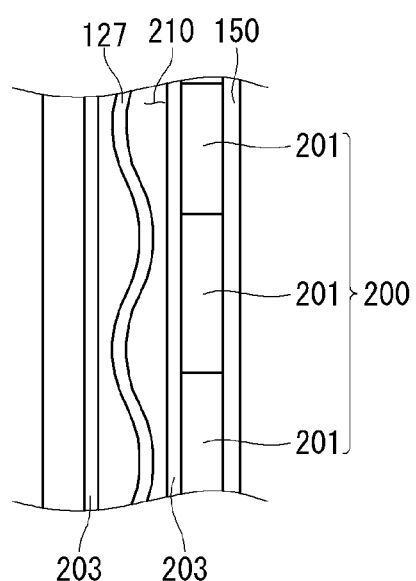

Referring to FIGS. 19A and 19B, the second connecting member 127 may repeatedly come into contact with the inside surface of the reinforce structure 200 as the rolling operation of the flexible display panel 150 is repeated. To prevent damage to the second connecting member 127 caused by contact with the reinforcing structure 200, a first buffering member 203 may be further provided on the inside surface of the reinforcing structure 200 to reduce friction with and impact from the second connecting member 127. The first buffering member 203 may be placed throughout the inside surface of the through hole 210.

Moreover, the second connecting member 127 may be kept a predetermined distance away from the flexible display panel 150 by means of the first buffering member 203. Accordingly, signal interference between the second connecting member 127 and the flexible display panel 150 can be reduced.

The first buffering member 203 may be selectively provided in some part of the inside surface of the through hole 210. For example, a plurality of first buffering members 203 may be provided, and they may be kept at a predetermined distance from one another. In this case, the first buffering members 203 protrude from the inside of the through hole 210, so they are placed close to the second connecting member 127 inserted into the through hole 210. This means that the second connecting member 127 does not come into contact with the inside surface of the reinforcing structure 200 but may be brought into contact with first buffering member 203 adjacent to it. In this case, the second connecting member 127 may fit into the space where there are no first buffering members 203, so there is no need to make additional space for accommodating the second connecting member 127. This means that there is no need to increase the overall thickness of the reinforcing structure 200 in order to make space for accommodating the second connecting member 127.

Third Exemplary Embodiment

Now, a rollable display according to a third exemplary embodiment of the present invention will be described with reference to FIGS. 20 to 21. FIGS. 20 and 21 are views for explaining a third exemplary embodiment of the present invention.

Figure 20A:
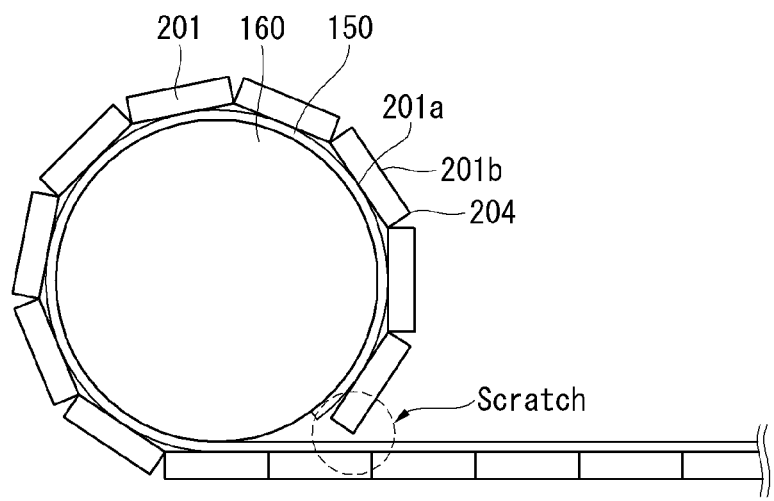
FIGS. 20A through 21 are views for explaining a third exemplary embodiment of the present invention.
Figure 20B:
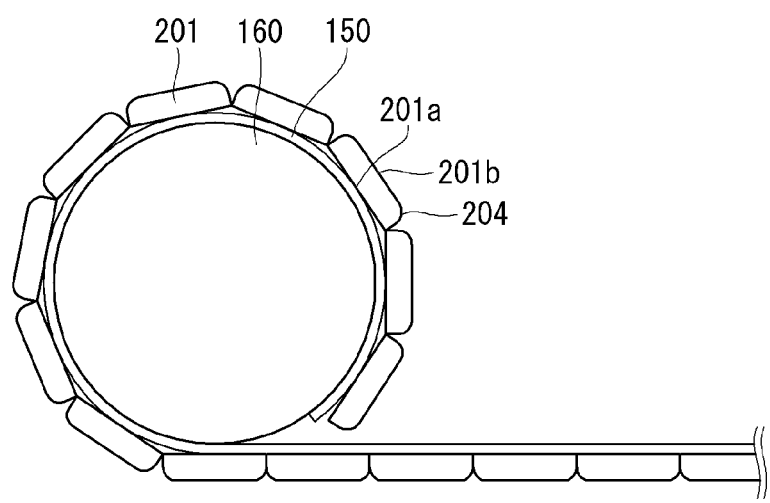
Figure 20C:
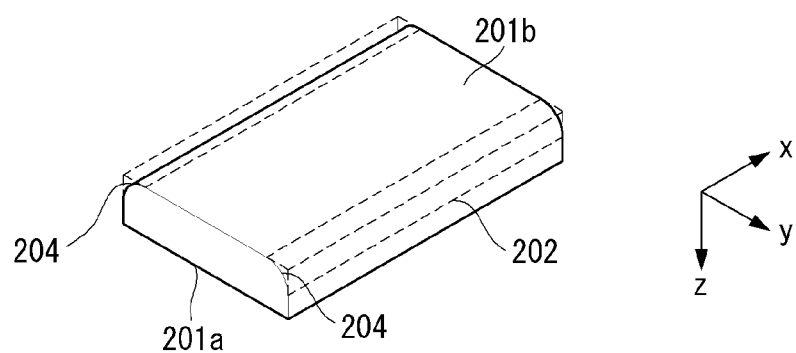
Figure 21:
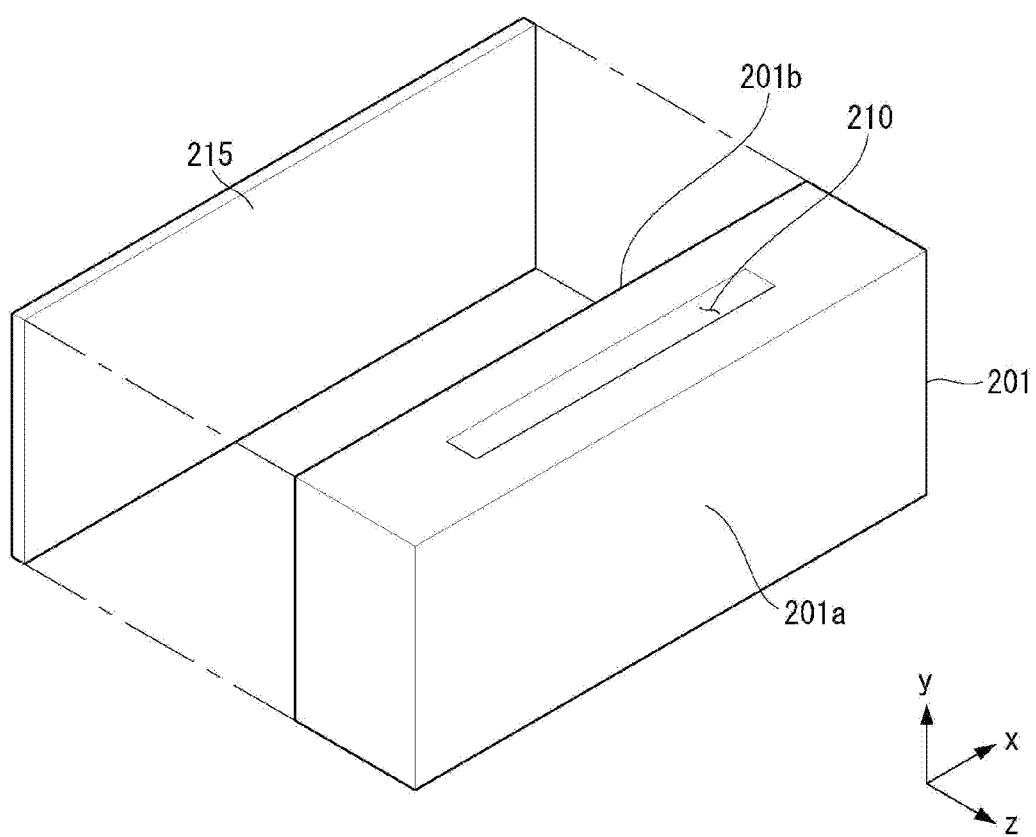

Referring to FIGS. 20A through 20C, the edges 204 of the segments 201 constituting the reinforcing structure 200 may come into contact with the flexible display panel 150 during the rolling operation of the flexible display panel 150, thus causing damage to the flexible display panel 150. Specifically, each of the segments 201 constituting the reinforcing structure 200 comprises an attaching surface 201a bonded directly to the flexible display panel 150 and an attached surface 201b opposite the attaching surface 201a. As illustrated in FIG. 20C, the side surfaces 202 is provided between the attaching surface 201a and the attached surface 201b. Among the edges 204 of the attached surface 201b, those extending in the first direction may make contact with the flexible display panel 150 during rolling operation and leave scratches on the flexible display panel 150.

To prevent scratches on the flexible display panel 150, in the third exemplary embodiment of the present invention, the edges 204 of the attached surface 201b that extend in the first direction may have rounded with a predetermined curvature. The edges 204 with a predetermined curvature may be formed by abrasion or etching, or may be molded through extrusion.

Alternatively, referring to FIG. 21, the rollable display according to the third exemplary embodiment of the present invention may include a second buffering member 215 provided on the attached surface 201b. The second buffering member 215 may be bonded to the attached surface 201b. The second buffering member 215 may have a size corresponding to the size of the attached surface 201b. The second buffering member 215 may comprise, but is not limited to, at least either foam tape, or a foam board.

Accordingly, the third exemplary embodiment of the present invention can reduce damage to the flexible display panel 150 caused by friction between the segments 201 of the reinforcing structure 200 and the flexible display panel 150 during the rolling operation of the flexible display panel 150.

Fourth Exemplary Embodiment

Figure 22:
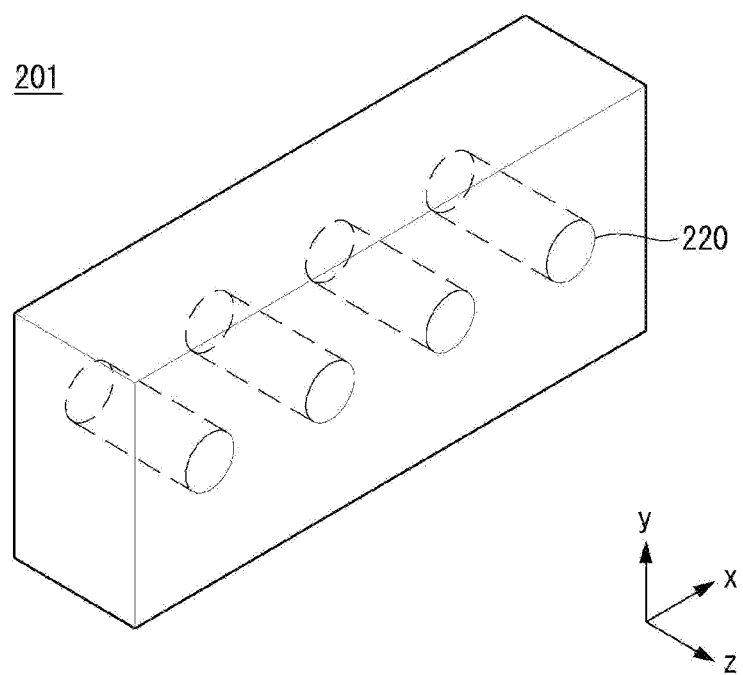
FIG. 22 is a view for explaining a fourth exemplary embodiment of the present invention.

Now, a rollable display according to a fourth exemplary embodiment of the present invention will be described with reference to FIG. 22. FIG. 22 is a view for explaining a fourth exemplary embodiment of the present invention.

Referring to FIG. 22, a recess 220 may be formed in each segment 201, respectively, to make the reinforcing structure 200 lightweight. The recess 220 may have the shape of a hole bored through the segment 201 or the shape of a groove partially cut into the segment 201. If required, a plurality of recesses 220 may be provided, and the recesses 220 may be spaced apart by a set distance from one another.

The fourth exemplary embodiment of the present invention offers, among others, the advantage of making the reinforcing structure 200 lightweight by forming the recesses 220 in the segments 201. Moreover, the recesses 220 of the segments 201 may function as a heat dissipation path for releasing heat out of the flexible display panel 150 by taking the shape of holes bored through the segments 201. In this case, the recesses 220 may be formed in a third direction (e.g., z direction). Accordingly, the fourth exemplary embodiment of the present invention offers the advantage of providing a rollable display with better heat dissipation properties.

Fifth Exemplary Embodiment

Figure 23:
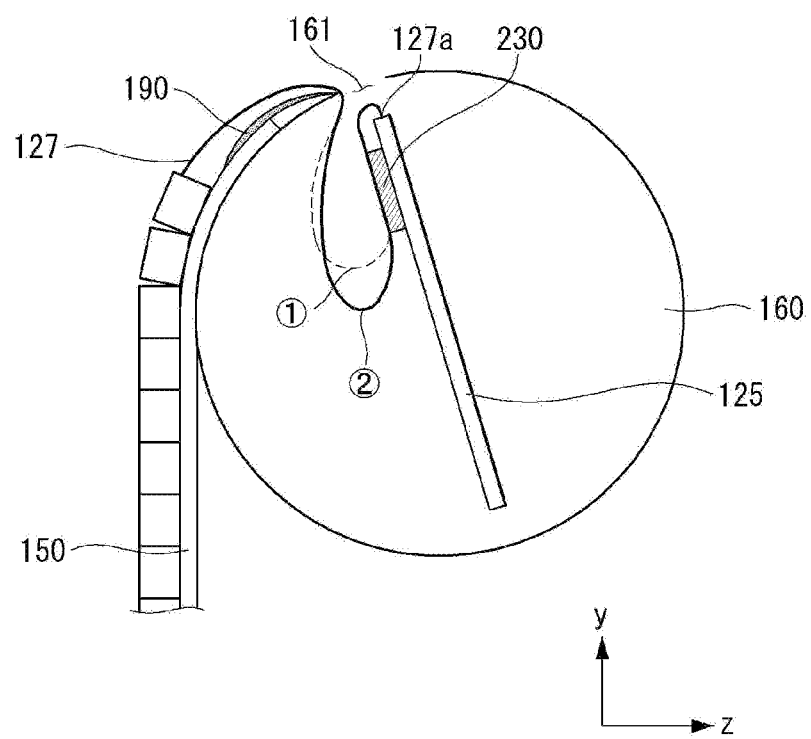
FIG. 23 is a cross-sectional view for explaining a fifth exemplary embodiment of the present invention.

Now, a rollable display according to a fifth exemplary embodiment of the present invention will be described with reference to FIG. 23. FIG. 23 is a view for explaining a fifth exemplary embodiment of the present invention.

As previously stated, the second connecting member 127 has enough length. That is, when the flexible display panel 150 is in the second state, the second connecting member 127 is longer than or equal to the length between the control board 125 and the data PCB 135. Thus, the second connecting member 127 may stick out too much in some area and hang loose. To prevent this, an exemplary embodiment of the present invention further comprises a reinforcing structure 200.

However, even with the addition of the reinforcing structure, the reinforcing structure 200 may not cover the entire length of the second connecting member 127. This means that an extra part of the second connecting member 127 may be left outside the reinforcing structure 200. If the extra part of the second connecting member 127 is repeatedly bent to a large curvature, stress is applied to a joint 127a where the second connecting member 127 and the control board 125 are joined together, which may lead to cracking or disconnection.

To prevent cracking or disconnection, the rollable display according to the fifth exemplary embodiment of the present invention further comprises an adhesive member 230 for fixing the second connecting member 127 to one side of the control board 125 in the internal space of the roller 160. The adhesive member 230 may be, but not limited to, double-sided tape.

As the extra part of the second connecting member 127 is fixed to one side of the control board 125, the joint 127a joining the second connecting member 127 and the control boar 125 together may be stably fixed when the flexible display panel 150 is rolled or unrolled. Accordingly, the fifth exemplary embodiment of the present invention can prevent a faulty connection between the second connecting member 127 and the control board 125.

Moreover, the fifth exemplary embodiment of the present invention allows the extra part of the second connecting member 127 to be left in the internal space of the roller 160 by fixing the extra part of the second connecting member 127 to one side of the control board 125. This means that the second connecting member 127 may be restrained within the through hole 210 of the reinforcing structure 200 and the internal space of the roller 160. That is, the second connecting member 127 may be restrained within the through hole 210 of the reinforcing structure 200 if it is outside the roller 160, and may be restrained within the internal space of the roller 160 if it is inside the roller 160.

In the drawing, ① and ② indicate how the second connecting member 127 changes its position inside the roller 160, along with a change in the state of the flexible display panel 150. When the flexible display panel 150 is in the first state, the extra part of the second connecting member 127 may be positioned as indicated by ①. When the flexible display panel 150 is in the second state, the extra part of the second connecting member 127 may be positioned as indicated by ②. In this way, the extra part of the second connecting member 127 may be left in the internal space of the roller 160 when the flexible display panel 150 changes its state.

The fifth exemplary embodiment of the present invention can reduce friction or collision with external structures caused by the second connecting member 127 sticking out too much.

Sixth Exemplary Embodiment

Figure 24:
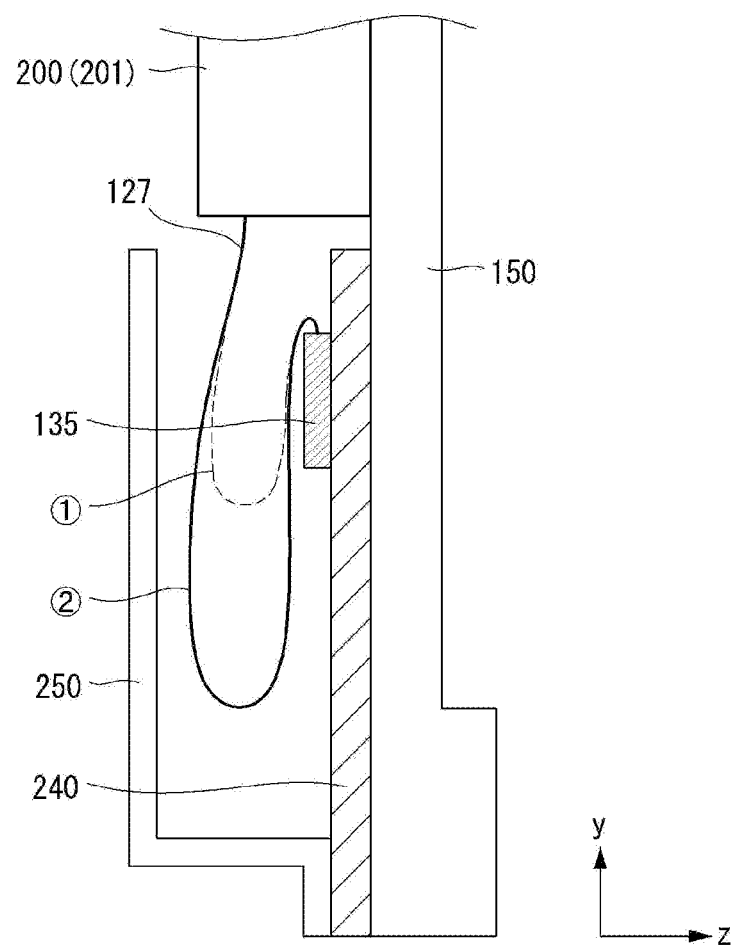
FIG. 24 is a cross-sectional view for explaining a sixth exemplary embodiment of the present invention.

Now, a rollable display according to a sixth exemplary embodiment of the present invention will be described with reference to FIG. 24. FIG. 24 is a view for explaining a sixth exemplary embodiment of the present invention.

Referring to FIG. 24, the sixth exemplary embodiment of the present invention may further comprise a support block 240 and a cover holder 250. The support block 240 is provided between the flexible display panel 150 and the data PCB 135. The support block 240 is located at the other end of the flexible display panel 150. The other end of the flexible display panel 150 is one of the two ends of the flexible display panel 140 that is not fixed directly to the roller 160. The front side of the support block 240 may be bonded to the rear side of the flexible display panel 150, and the data PCB 135 may be bonded and fixed to the rear side of the support block 240.

The support block 240 may function to apply a predetermined load to the other end of the flexible display panel 150. Specifically, in the case of a rollable display which can be rolled down from the roller 160, it is necessary to apply a predetermined load to the other end of the flexible display panel 150 in order for the flexible display panel 150 to maintain the second state. To this end, the support block 240 has a predetermined weight.

The cover holder 250 may be bonded to the rear side of the support block 240. The cover holder 250 may be bonded to the support block 240 in an area where the first connecting member 145 connecting the flexible display panel 150 and the data PCB 135 is not located. The cover holder 240 has such a shape that can cover the extra part of the second connecting member 127 that may hang loose from the other end of the roller 160. The cover holder 250 may accommodate the extra part of the second connecting members 127 in it since it has a shape that opens in the second direction.

The extra part of the second connecting member 127 can be accommodated in the through hole 210 of the reinforcing structure 200. However, the reinforcing structure 200 needs to be made thicker in order to fully accommodate the long-enough second connecting member 127 in the through hole 210.

The rollable display according to the sixth exemplary embodiment of the present invention can reduce the thickness of the reinforcing structure 200 to make the display slim and accommodate the extra part of the second connecting member 127, which cannot be accommodated in the through hole 210 of the reinforcing structure 200, in the cover holder 250, along with the reduction in the thickness of the reinforcing structure 200.

In the drawing, ① and ② indicate how the second connecting member 127 changes its position inside the cover holder 250, along with a change in the state of the flexible display panel 150. When the flexible display panel 150 is in the first state, the extra part of the second connecting member 127 may be positioned as indicated by ①. When the flexible display panel 150 is in the second state, the extra part of the second connecting member 127 may be positioned as indicated by ②. In this way, the extra part of the second connecting member 127 may be left in the internal space of the cover holder 250 when the flexible display panel 150 changes its state.

Accordingly, the sixth exemplary embodiment of the present invention offers the advantage of providing a slim and lightweight rollable display.

Seventh Exemplary Embodiment

Figure 25A:
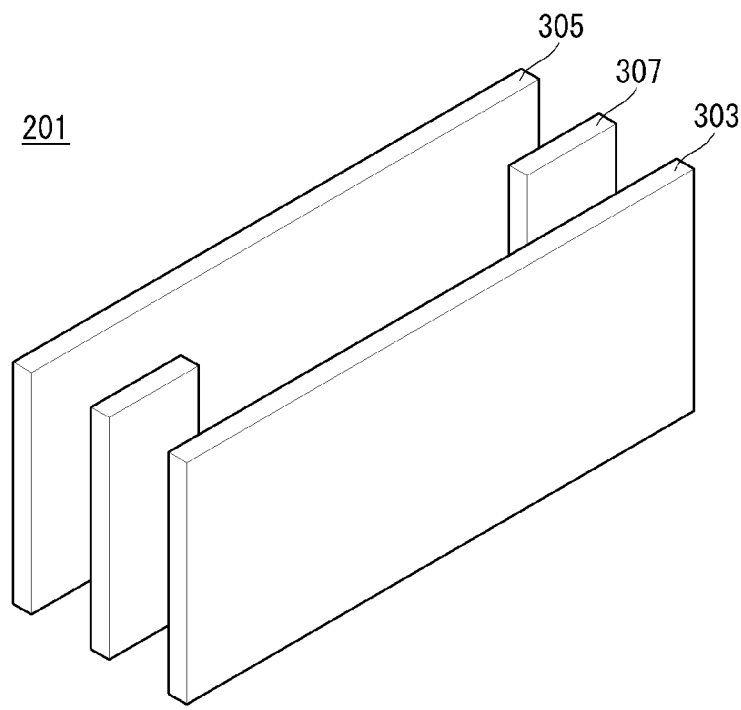
FIGS. 25A and 25B are perspective views for explaining a seventh exemplary embodiment of the present invention.
Figure 25B:
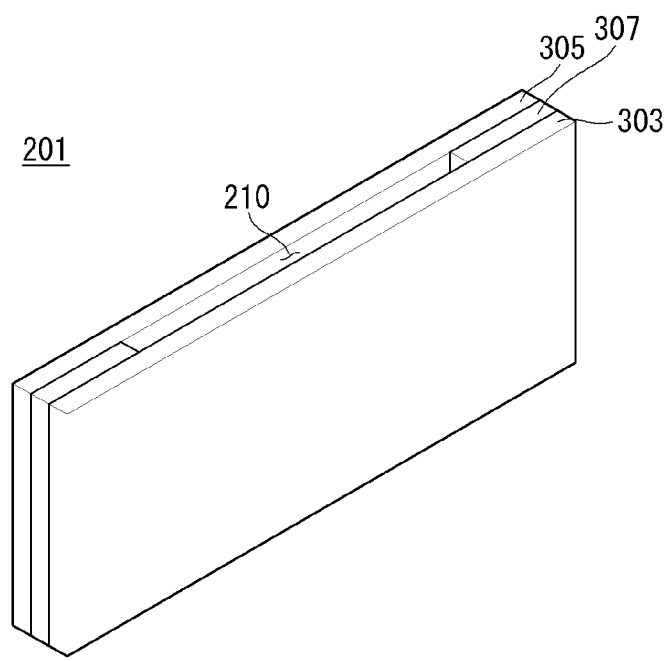

Now, a rollable display according to a seventh exemplary embodiment of the present invention will be described with reference to FIG. 25. FIG. 25 is a view for explaining a seventh exemplary embodiment of the present invention.

Referring to FIG. 25, the reinforcing structure 200 according to the seventh exemplary embodiment of the present invention comprises a plurality of segments 201, and each segment 201 comprises a front case 303, a rear case 359, and a middle case 307 which form the appearance. The front case 303 is placed on the rear side of the flexible display panel 150 and bonded directly to the flexible display panel 150. The rear case 305 is placed opposite the front case 303. At least one middle case 307 is placed between the front case 303 and the rear case 305. The second connecting member 127 is inserted into the through hole 210 provided inside the front case 303, rear case 305, and middle case 307 that are joined together.

The front case 303, rear case 305, and middle case 307 may be integrated as a single unit, or may be formed separately and later fastened to one another. At least either the front case 303 or the rear case 305 may be formed integrally with the middle case 307.

The front case 303, rear case 305, and middle case 307 may be made of the same material, and at least one among the front case 303, rear case 305, and middle case 307 may be made of a different material from the rest.

To reinforce the rigidity of the flexible display panel 150, the front case 303 and the middle case 307 may comprise metal such as stainless steel or aluminum. To reduce friction with or absorb impact from other structures, the rear case 305 may comprise material such as rubber, silicon, or urethane.

When the flexible display panel 150 changes its state, the rear case 305 may collide with the flexible display panel 150 and cause damage to the flexible display panel 150. The seventh exemplary embodiment of the present invention can prevent damage to the flexible display panel 150 since the rear case 305 is made with a material that has buffering properties, and reinforce the rigidity of the flexible display panel 150 since the front case 303 is made with a material that has rigidity.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A rollable display comprising:
   a display panel having a display area and a non-display area including:
   a scan driver configured to supply a scan signal to the display panel; and
   a reinforcing structure on a rear side of the display panel and a plurality of segments;
   a panel roller having a circumference surface onto which the display panel is rolled;
   a control board in the panel roller;
   an auxiliary sheet attached to one end of the display panel to couple the display panel to
      the panel roller, wherein the auxiliary sheet mitigates the mechanical stress at the edge of the display panel when the display panel is rolled around the panel roller;
   a first connecting member electrically connected to the control board to supply a data signal to the display panel; and
   a second connecting member that electrically connects the control board to a printed circuit board to transmit signals for displaying images on the display panel,
   wherein the scan driver is disposed on at least one side of the display area of the display panel and a plurality of data drivers are disposed along with a direction perpendicular to a rolling direction of the display panel,
   wherein the plurality of segments of the reinforcing structure are arranged along with the direction parallel to the rolling direction of the display panel,
   wherein each of the plurality of segments comprises at least one through hole,
   wherein the second connecting member is slidably inserted into the at least one through hole, and
   wherein an end of the first connecting member is attached to an end of a data printed circuit board, wherein an end of the second connecting member is attached to the other end of the data printed circuit board.

2. The rollable display of claim 1, wherein the scan driver is formed in a gate in panel (GIP) structure in the non-display area of the display panel.

3. The rollable display of claim 1, wherein the scan driver are disposed on both the left and right sides of the display area of the display panel.

4. The rollable display of claim 1, wherein the scan driver is disposed along with the rolling direction of the display panel.

5. The rollable display of claim 1, wherein the display area comprises subpixels,
   wherein the subpixels include a switching transistor, a drive transistor, a capacitor, a compensation circuit and an organic light emitting diode (OLED).

6. The rollable display of claim 1, wherein each of the segments has a shape of a bar.

7. The rollable display of claim 1, wherein adjacent segments are connected through hinge.

8. The rollable display of claim 1, wherein adjacent segments are spaced apart by a set distance.

9. The rollable display of claim 1, further comprising at least a third connecting member, wherein each of the segments comprises at least another through hole, wherein at least the third connecting member is inserted into the at least another through hole.

10. The rollable display of claim 1, further comprising an adhesive member that fixes part of the second connecting member to at least one side of the control board.

11. The rollable display of claim 1, further comprising:
    a support block provided between the display panel and the printed circuit board; and
    a cover holder that is bonded to the support block and accommodates part of the second connecting member.

12. The rollable display of claim 6, wherein a surface of an edge of at least a subset of the segments comes into contact with the display panel when the display panel is rolled onto the panel roller.

13. The rollable display of claim 1, wherein a number of through holes corresponds to a number of second connecting members.

* * * * *